(12) United States Patent
Takahashi et al.

(10) Patent No.: US 9,087,605 B2
(45) Date of Patent: Jul. 21, 2015

(54) SEMICONDUCTOR STORAGE DEVICE

(75) Inventors: Hiroyuki Takahashi, Kanagawa (JP);
Ryoutaka Kitou, Kanagawa (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 385 days.

(21) Appl. No.: 13/437,783

(22) Filed: Apr. 2, 2012

(65) Prior Publication Data

US 2012/0262976 A1    Oct. 18, 2012

(30) Foreign Application Priority Data

Apr. 12, 2011    (JP) .................................. 2011-087971

(51) Int. Cl.
| | | |
|---|---|---|
| G11C 11/4097 | (2006.01) | |
| G11C 11/4094 | (2006.01) | |
| G11C 11/4099 | (2006.01) | |
| H01L 27/02 | (2006.01) | |
| H01L 27/105 | (2006.01) | |
| H01L 27/108 | (2006.01) | |
| H01L 27/088 | (2006.01) | |

(52) U.S. Cl.
CPC ........ *G11C 11/4097* (2013.01); *G11C 11/4094* (2013.01); *G11C 11/4099* (2013.01); *H01L 27/0207* (2013.01); *H01L 27/105* (2013.01); *H01L 27/10885* (2013.01); *H01L 27/10897* (2013.01); *H01L 27/088* (2013.01)

(58) Field of Classification Search
CPC ........... G11C 11/4097; G11C 11/4094; G11C 11/4099; H01L 27/105; H01L 27/0207; H01L 27/10897; H01L 27/10885; H01L 27/088

USPC ................. 365/149, 202, 230.03, 51, 63, 72
See application file for complete search history.

(56) References Cited

U.S. PATENT DOCUMENTS

| | | | |
|---|---|---|---|
| 5,528,542 A | 6/1996 | Okamura | |
| 5,602,772 A | 2/1997 | Nakano et al. | |
| 6,094,390 A * | 7/2000 | Inaba et al. | ................... 365/203 |
| 6,501,672 B1 | 12/2002 | Sekiguchi et al. | |
| 6,515,906 B2 * | 2/2003 | Tedrow et al. | ........... 365/185.21 |
| 6,788,568 B2 | 9/2004 | Hidaka | |
| 6,795,326 B2 * | 9/2004 | Chevallier | ........................ 365/63 |
| 7,184,301 B2 | 2/2007 | Sugibayashi et al. | |
| 2002/0172073 A1 * | 11/2002 | Hidaka | .......................... 365/158 |
| 2008/0253159 A1 * | 10/2008 | Kajigaya | ......................... 365/51 |

FOREIGN PATENT DOCUMENTS

| | | |
|---|---|---|
| CN | 1383155 A | 12/2002 |
| JP | 4-264769 | 9/1992 |

(Continued)

OTHER PUBLICATIONS

Japanese Office Action dated Sep. 30, 2014 with an English Translation thereof.

(Continued)

*Primary Examiner* — J. H. Hur
(74) *Attorney, Agent, or Firm* — McGinn IP Law Group, PLLC

(57) ABSTRACT

When plural diffusion layers are shared in order to save an area of a semiconductor integrated circuit, parasitic capacities of wirings coupled to those diffusion layers are changed. Nonetheless, a semiconductor layout balancing capacitive loads of paired wirings coupled to the diffusion layers with each other is provided. The diffusion layers coupled to the respective paired wirings are alternately arranged or staggered to balance the respective capacitive loads of the paired wirings with each other.

19 Claims, 12 Drawing Sheets

(56) References Cited

FOREIGN PATENT DOCUMENTS

| JP | 7-254650 A | 10/1995 |
| JP | 3004177 B2 | 1/2000 |
| JP | 2001 118999 | 4/2001 |
| JP | 2004-348934 A | 12/2004 |

OTHER PUBLICATIONS

Chinese Office Action dated Feb. 17, 2015 with an English translation thereof.

* cited by examiner

SEMICONDUCTOR STORAGE DEVICE

CROSS-REFERENCE TO RELATED APPLICATIONS

The disclosure of Japanese Patent Application No. 2011-087971 filed on Apr. 12, 2011 including the specification, drawings and abstract is incorporated herein by reference in its entirety.

BACKGROUND

The present invention relates to a semiconductor storage device, and more particularly to a dynamic semiconductor storage device.

In the dynamic semiconductor storage device, a reduction in circuit area is an important task. As a method of reducing the circuit area, there has been known a technique in which a coupling destination diffusion layer having a switch that column-selects signals output from sense amplifiers of a folding bit line system is shared by repetition of an array structure.

FIG. 1 is a layout diagram illustrating a semiconductor layout of open bit sense amplifiers in a general semiconductor memory device. The semiconductor layout of the sense amplifiers in FIG. 1 will be described.

The layout diagram of FIG. 1 illustrates first to fourth sense amplifiers SA1 to SA4, first to fourth bit lines BL1 to BL4, first to fourth dummy bit lines DBL1 to DBL4, first and second word lines WL1 and WL2, first and second dummy word lines DWL1 and DWL2, first to eighth memory cells MC1 to MC8, and first to eighth dummy cells DC1 to DC8.

In a lateral direction of FIG. 1, the first to fourth bit lines BL1 to BL4 and the first to fourth dummy bit lines DBL1 to DBL4 are arranged in parallel. In this example, the first dummy hit line DBL1 is arranged on an extension of the first bit line BL1. Likewise, the second to fourth dummy bit lines DBL2 to DBL4 are arranged on extensions of the second to fourth bit lines BL2 to BL4, respectively.

In a direction orthogonal to the first to fourth bit lines BL1 to BL4 and the first to fourth dummy bit lines DBL1 to DBL4, that is, in a longitudinal direction of FIG. 1, the first and second word lines WL1 and WL2, and the first and second dummy word lines DWL1 and DWL2 are arranged in parallel.

The first to fourth sense amplifiers SA1 to SA4 are arranged in a matrix between the first and second word lines WL1 and WL2, and the first and second dummy word lines DWL1 and DWL2. That is, the first and second sense amplifiers SA1 and SA2 are arranged on extensions of the first and second bit lines BL1 and BL2, and the first and second dummy bit lines DBL1 and DBL2, so as to be adjacent to each other in a direction of the extension. Likewise, the third and fourth sense amplifiers SA3 and SA4 are arranged on extensions of the third and fourth bit lines BL3 and BL4, and the third and fourth dummy bit lines DBL3 and DBL4, so as to be adjacent to each other in a direction of the extension. The first to third sense amplifiers SA1 and SA3 are arranged adjacent to each other in a direction of the first and second word lines WL1 and WL2. Likewise, the second and fourth sense amplifiers SA2 and SA4 are arranged adjacent to each other in a direction of the first and second word lines WL1 and WL2.

The first to eighth memory cells MC1 to MC8 are arranged in a matrix at intersections of the first to fourth bit lines BL1 to BL4, and the first and second word lines WL1 and WL2. In this example, the first to fourth memory cells MC1 to MC4 are arranged at the intersections of the first word line WL1, and the first to fourth bit lines BL1 to BL4, respectively. Also, the fifth to eighth memory cells MC5 to MC8 are arranged at the intersections of the second word line WL2, and the first to fourth bit lines BL1 to BL4, respectively.

Likewise, the first to eighth dummy cells DC1 to DC8 are arranged in a matrix at intersections of the first to fourth dummy bit lines DBL1 to DBL4, and the first and second dummy word lines DWL1 and DWL2. In this example, the first to fourth dummy cells DC1 to DC4 are arranged at the intersections of the first dummy word line DWL1, and the first to fourth dummy bit lines DBL1 to DBL4, respectively. Also, the fifth to eighth dummy cells DC5 to DC8 are arranged at the intersections of the second dummy word line DWL2, and the first to fourth dummy bit lines The first sense amplifier SA1 has one end coupled to the first bit line BL1, and the other end coupled to the first dummy bit line DBL1. Likewise, the second to fourth sense amplifiers SA2 to SA4 have one ends coupled to the second to fourth bit lines BL2 to BL4, and the other ends coupled to the second to fourth dummy bit lines DBL2 to DBL4, respectively.

The first word line WL1 is coupled to the first to fourth memory cells MC1 to MC4. The second word line WL2 is coupled to the fifth to eighth memory cells MC5 to MC8. Likewise, the first dummy word line DWL1 is coupled to the first to fourth dummy cells DC1 to DC4. The second dummy word line DWL2 is coupled to the fifth to eighth dummy cells DC5 to DC8.

The first bit line BL1 is coupled to the first and fifth memory cells MC1 and MC5. The second bit line BL2 is coupled to the second and sixth memory cells MC2 and MC6. The third bit line BL3 is coupled to the third and seventh memory cells MC3 and MC7. The fourth bit line BL4 is coupled to the fourth and eighth memory cells MC4 and MC8.

Likewise, the first dummy bit line DBL1 is coupled to the first and fifth dummy cells DC1 and DC5. The second dummy bit line DBL2 is coupled to the second and sixth dummy cells DC2 and DC6. The third dummy bit line DBL3 is coupled to the third and seventh dummy cells DC3 and DC7. The fourth dummy bit line DBL4 is coupled to the fourth and eighth dummy cells DC4 and DC8.

The first to fourth bit lines BL1 to BL4 communicate information charge with the first to eighth memory cells MC1 to MC8. Likewise, the first to fourth dummy bit lines DBL1 to DBL4 communicate information charge with the first to eighth dummy cells DC1 to DC8.

Any one of the first and second word lines WL1 and WL2 is selected to conduct the selection of the first to eighth memory cells MC1 to MC8. In this situation, likewise, any one of the first and second dummy word lines DWL1 and DWL2 is selected to conduct the selection of the first to eighth dummy cells DC1 to DC8.

In this example, any memory cell is arranged at all of the intersections between the first to fourth bit lines BL1 to BL4, and the first and second word lines WL1 and WL2. Likewise, any dummy cell is arranged at all of the intersections of the first to fourth dummy bit lines DBL1 to DBL4, and the first and second dummy word lines DWL1 and DWL2. That is, a configuration of the bit lines corresponding to the cell array is of an open type.

Each of the first to eighth memory cells MC1 to MC8 is configured by one transistor and one capacitor. Each of those memory cells stores binary data of one bit as charging and discharging states of the capacitor therein, and inputs and outputs the data through the transistor selected by the bit line and the word line coupled to two terminals thereof.

FIG. 3 is a block diagram illustrating wiring for a BUS signal, a dummy bus signal, and a column select signal in the sense amplifiers in a simplified layout diagram of FIG. 1. The block diagram of FIG. 3 illustrates a first memory cell array MCA1, a second memory cell array MCA2, a first sense amplifier circuit SA1, a second sense amplifier circuit SA2, a first bit line BL1, a second bit line BL2, a first dummy bit line DBL1, a second dummy bit line DBL2, a first column select signal line YSW1, a second column select signal line YSW2, a bus line BUS1, and a dummy bus line DBUS1.

In the block diagram of FIG. 3, the first memory cell array MCA1 corresponds to the first, second, fifth, and sixth memory cells MC1, MC2, MC5, and MC6 in FIG. 1. The second memory cell array MCA2 corresponds to the first, second, fifth, and sixth dummy cells DC1, DC2, DC5, and DC6 in FIG. 1. The first sense amplifier circuit SA1, the second sense amplifier circuit SA2, the first bit line BL1, the second bit line BL2, the first dummy bit line DBL1, and the second dummy bit line DBL2 are denoted by the same symbols in FIGS. 1 and 2.

FIG. 2 is a circuit block diagram schematically illustrating an internal configuration of the first sense amplifier circuit SA1 in FIG. 3. Referring to FIG. 2, the first sense amplifier circuit SA1 includes a sense amplifier SA, an equalizer circuit EQ, and a transfer circuit DQ. The transfer circuit DQ includes a first transistor DQT1 and a second transistor DQT2.

The first column select signal line YSW1 is coupled to the first sense amplifier circuit SA1. Similarly, the second column select signal line YSW2 is coupled to the second sense amplifier circuit SA2 (not shown in FIG. 2). The first bit line BL1 and the first dummy bit line DBL1 are coupled to the first sense amplifier circuit SA1. The second bit line BL2 and the second dummy bit line DBL2 are coupled to the second sense amplifier circuit SA2.

In the first sense amplifier circuit SA1 of FIG. 2, the first bit line BL1 is commonly coupled to one end of the sense amplifier SA, one end of the equalizer circuit EQ, and one of a source and a drain of the first transistor DQT1 in the transfer circuit DQ. The first dummy bit line DBL1 is commonly coupled to the other end of the sense amplifier SA, the other end of the equalizer circuit EQ, and one of a source and a drain of the second transistor DQT2. The bus line BUS1 is coupled to the other of the source and the drain of the first transistor DQT1. The dummy bus line DBUS1 is coupled to the other of the source and the drain of the second transistor DQT2 in the transfer circuit DQ. The first column select signal line YSW1 is commonly coupled to gates of the first and second transistors DQT1 and DQT2 in the transfer circuit DQ.

Referring to FIGS. 2 and 3, the operation of the sense amplifier circuit in a related art will be described. First, the sense amplifier SA determines values of the respective signals that are transmitted through the first bit line BL1 and the first dummy bit line DBL1. Then, the first column select signal line YSW1 transmits the respective signals decided by the first bit line BL1 and the first dummy bit line DBL1 toward an external circuit through the bus line BUS1 and the dummy bus line DBUS1. Thereafter, the signals transmitted through the bus line BUS1 and the dummy bus line DBUS1 are amplified by a downstream circuit. Accordingly, a difference in signal capacity between the bus line BUS1 and the dummy bus line DBUS1 needs to be reduced as much as possible. This is because the large difference in the signal capacity may cause a malfunction or a speed delay in the downstream circuit.

FIG. 4A is a circuit diagram illustrating a portion relating to the first to fourth transfer circuits DQ1 to DQ4 in the first to fourth sense amplifiers SA1 to SA4, extracted from the semiconductor memory device of FIG. 1. The circuit diagram of FIG. 4A includes first to fourth transfer circuits DQ1 to DQ4, first to fourth column select signal lines YSW1 to YSW4, the first to fourth bit lines BL1 to BL4, the first to fourth dummy bit lines DBL1 to DBL4, the bus line BUS1, and the dummy bus line DBUS1. The first transfer circuit DQ1 includes a first transistor DQ1T1 and a second transistor DQ1T2. The second transfer circuit DQ2 includes a first transistor DQ2T1 and a second transistor DQ2T2. The third transfer circuit DQ3 includes a first transistor DQ3T1 and a second transistor DQ3T2. The fourth transfer circuit DQ4 includes a first transistor DQ4T1 and a second transistor DQ4T2.

The first column select signal line YSW1 is commonly coupled to the respective gates of the first and second transistors DQ1T1 and DQ1T2 in the first transfer circuit DQ1. The first bit line BL1 is coupled to one of a source and a drain of the first transistor DQ1T1 in the first transfer circuit DQ1. The first dummy bit line DBL1 is coupled to one of a source and a drain of the second transistor DQ1T2 in the first transfer circuit DQ1.

Likewise, when an index i is generalized as any one of integers 2 to 4, an i-th column select signal line YSWi is commonly coupled to the respective gates of first and second transistors DQiT1 and DQiT2 in an i-th transfer circuit DQi. An i-th bit line BLi is coupled to one of a source and a drain of the first transistor DQiT1 in the i-th transfer circuit DQi. An i-th dummy bit line DBLi is coupled to one of a source and a drain of the second transistor DQiT2 in the i-th transfer circuit DQi.

The bus line BUS1 is commonly coupled to the other of the source and the drain of the respective first transistors DQ1T1 to DQ4T1 in the first to fourth transfer circuits DQ1 to DQ4. The dummy bus line DBUS1 is commonly coupled to the other of the source and the drain of the respective second transistors DQ1T2 to DQ4T2 in the respective first to fourth transfer circuits DQ1 to DQ4.

FIG. 4B is a plan view illustrating a semiconductor layout according to the circuit diagram of FIG. 4A. Each of the first and second transistors DQ1T1 to DQ4T1 and DQ1T2 to DQ4T2 in the respective first to fourth transfer circuits DQ1 to DQ4 is drawn as a diffusion layer and a gate formed on the diffusion layer. In this example, portions of the diffusion layer on both sides of the gate in each transistor operate as the source and the drain. Also, the first to fourth column select signal lines YSW1 to YSW4 are drawn as wires that couple the gates of the two transistors.

FIG. 4C is a plan view illustrating a semiconductor layout in which the semiconductor layout of FIG. 4B is improved to share the diffusion layers of partial transistors. The semiconductor layout of FIG. 4C is equivalent to the semiconductor layout of FIG. 4B which is modified as follows. That is, a positional relationship of the first and second transistors DQ1T1 and DQ1T2 in the first transfer circuit DQ1 is first horizontally reversed. Further, a positional relationship of the source and the drain of each of the first and second transistors DQ1T1 and DQ1T2 in the first transfer circuit DQ1 is horizontally reversed. Then, the diffusion layer of one of the source and the drain of the first transistor DQ1T1 in the first transfer circuit DQ1, which is coupled to the bus line BUS1, and the diffusion layer of one of the source and the drain of the first transistor DQ2T1 in the second transfer circuit DQ2, which is coupled to the bus line BUS1, are integrated with each other. As a result, the first transistor DQ1T1 in the first transfer circuit DQ1 and the first transistor DQ2T1 in the second transfer circuit DQ2 are configured so that two gates are formed in one diffusion layer.

Likewise, a positional relationship of the first and second transistors DQ3T1 and DQ3T2 in the third transfer circuit DQ3 is first horizontally reversed. Further, a positional relationship of the source and the drain of each of the first and second transistors DQ3T1 and DQ3T2 in the third transfer circuit DQ3 is horizontally reversed. Then, the diffusion layer of one of the source and the drain of the first transistor DQ3T1 in the third transfer circuit DQ3, which is coupled to the bus line BUS1, and the diffusion layer of one of the source and the drain of the first transistor DQ4T1 in the fourth transfer circuit DQ4, which is coupled to the bus line BUS1, are integrated with each other. As a result, the first transistor DQ3T1 in the third transfer circuit DQ3 and the first transistor DQ4T1 in the fourth transfer circuit DQ4 are configured so that two gates are formed in one diffusion layer.

The semiconductor layout of FIG. 4C obtained by improving the semiconductor layout of FIG. 4B as described above is reduced in dimension in the lateral direction of the drawing so that a circuit area can be saved. On the other hand, there arises such a problem that a difference in capacity between the bus line BUS1 and the dummy bus line DBUS1 is increased as with a total area of the diffusion layers coupled with the respective lines.

In association with the above description, Japanese Unexamined Patent Application Publication No. Hei 7 (1995)-254650 discloses a technique pertaining to a dynamic semiconductor storage device. The dynamic semiconductor storage device in Japanese Unexamined Patent Application Publication No. Hei 7 (1995)-254650 includes a plurality of dynamic memory cells, a plurality of bit lines, a plurality of word lines, and sense amplifier blocks. In this configuration, the dynamic memory cells are arranged two-dimensionally. The bit lines communicate information with those memory cells. The word lines are arranged across those bit lines, and select the memory cells for extracting the information to the bit lines. In each of the sense amplifier blocks are arranged the sense amplifier coupled to the bit line and an equalizer circuit that equalizes the bit line in order to detect and amplify the information in the memory cell, which is extracted to the bit line. In the dynamic semiconductor storage device, a plurality of the sense amplifier blocks is arranged adjacent to each other in a direction of the bit lines. The bit line having another sense amplifier block existing between the bit line and a given sense amplifier block to be coupled is coupled with a wiring layer different from the wiring layer configuring the bit lines. This wiring layer passes through the another sense amplifier, and is coupled to the given sense amplifier block.

Also, Japanese Patent No. 3004177 discloses a technique pertaining to a semiconductor integrated circuit device. The semiconductor integrated circuit device of Japanese Patent No. 3004177 includes column gates each having a first circuit element, and sense circuits each having a second circuit element. In this example, the first and second circuit elements are integrated in the same pattern with each other. In the semiconductor integrated circuit device, each of the column gates includes at least a first transistor disposed in an element area of a semiconductor substrate as the first circuit element. Each of the sense circuits includes at least a second transistor having a common node with the first transistor disposed in the element area as the second circuit element.

Also, Japanese Unexamined Patent Application Publication No. 2004-348934 discloses a technique pertaining to the memory cell. The memory cell of Japanese Unexamined Patent Application Publication No. 2004-348934 includes a first transistor, and a magnetoresistive element. In this example, the first transistor includes a first gate, a first terminal as one terminal thereof other than the first gate, and a second terminal as the other terminal thereof. The magnetoresistive element has a spontaneous magnetization whose magnetization direction is reversed according to stored data, and includes a third terminal as one terminal thereof, and a fourth terminal as the other terminal thereof. The first terminal is coupled to the first bit line. The second terminal is coupled to the second bit line. The first gate is coupled to the first word line. The third terminal is coupled to the second work line. The fourth terminal is coupled to the second terminal.

SUMMARY

When the diffusion layers of the column select transistors extracted from the sense amplifiers to the bus lines are shared in the related art, the capacities among the complemented bus lines are unbalanced depending on a difference in the capacity among the diffusion layers of the column select transistors coupled to a bus line T/B (true/bar). As a result, during read operation for reading information in the memory cell, since bus drive from the bit line is conducted by analog operation of a small amplitude, there is a possibility that malfunction occurs in the amplifying operation of the bus line due to the above-mentioned unbalanced capacities when amplifying the bus line. Therefore, there is a need to equalize the diffusion layer capacities of the select transistors which are parasitic in the complemented bus line.

Hereinafter, a description will be given of a solution to problem by using reference numerals used in "Detailed Description". Those reference numerals are referred for the purpose of clarifying correspondence relationships between the definitions in "What is claimed is" and "Detailed Description". However, those reference numerals must not be used for interruption of technical scopes of the present invention, which are defined in "What is claimed is".

According to an aspect of the present invention, the semiconductor integrated circuit device includes a wiring pair ((BUS1, DBUS1), a first transistor group (DQiT1), a second transistor group (DQiT2), a first diffusion layer group, and a second diffusion layer group. In this example, the first transistor group (DQiT1) has a source or a drain coupled with one (BUS1) of the wiring pair. The second transistor group (DQiT2) has a source or a drain coupled with the other (DBUS1) of the wiring pair. The first diffusion layer group is formed with the first transistor group (DQiT1). The second diffusion layer group is formed with the second transistor group (DQiT2). The first diffusion layer group is equipped with a first common diffusion layer group. In this example, the first common diffusion layer group includes the first transistor group (DQiT1), and is also formed with a plurality of transistors (DQiT1) sharing the source or the drain. The second diffusion layer group is equipped with a second common diffusion layer group. In this example, the second common diffusion layer group includes the second transistor group (DQiT2), and is also formed with a plurality of transistors (DQiT2) sharing the source or the drain. The first capacitive load of the one (BUS1) of the wiring pair is balanced with the second capacitive load of the other (DBUS1) of the wiring pair.

According to another aspect of the present invention, the semiconductor storage device includes a wiring pair (BUS1, DBUS1), a first block (for example, DQ1T1 to DQ4T1 and DQ1T2 to DQ4T2, etc.), and a second block (for example, DQ5T1 to DQ8T1 and DQ5T2 to DQ8T2, etc.). In this example, the first block (for example, DQ1T1 to DQ4T1 and DQ1T2 to DQ4T2, etc.) includes a plurality of elements (for example, DQ1T1 and DQ2T1) which is coupled to any one (for example, BUS1) of the wiring pair (BUS1, DBUS1) through the first wiring. The second block (for example, DQ5T1 to DQ8T1 and DQ5T2 to DQ8T2, etc.) includes a plurality of elements which is coupled to any one of the wiring pair (BUS1, DBUS1) through the second wiring. The second block is arranged adjacent to the first block. The plurality of elements in the second block is identical with the plurality of elements in the first block. The number of first wirings coupled to one of the wiring pair is different from the number of second wirings.

According to the aspects of the present invention, the semiconductor storage device of the present invention, the diffusion layer groups which are the coupling destinations of the pair (T/B) of the bus lines coupled to the column select switch are alternately arranged or staggered. As a result, a distribution of the diffusion layer capacities in the bus line pair flattened at the time of amplifying the column-selected signal. Accordingly, the amplifying operation stable in the column-selected signal can be realized.

DETAILED DESCRIPTION

Modes for carrying out a semiconductor integrated circuit device according to the present invention will be described below with reference to the accompanying drawings.

First Embodiment

Figure 5A:
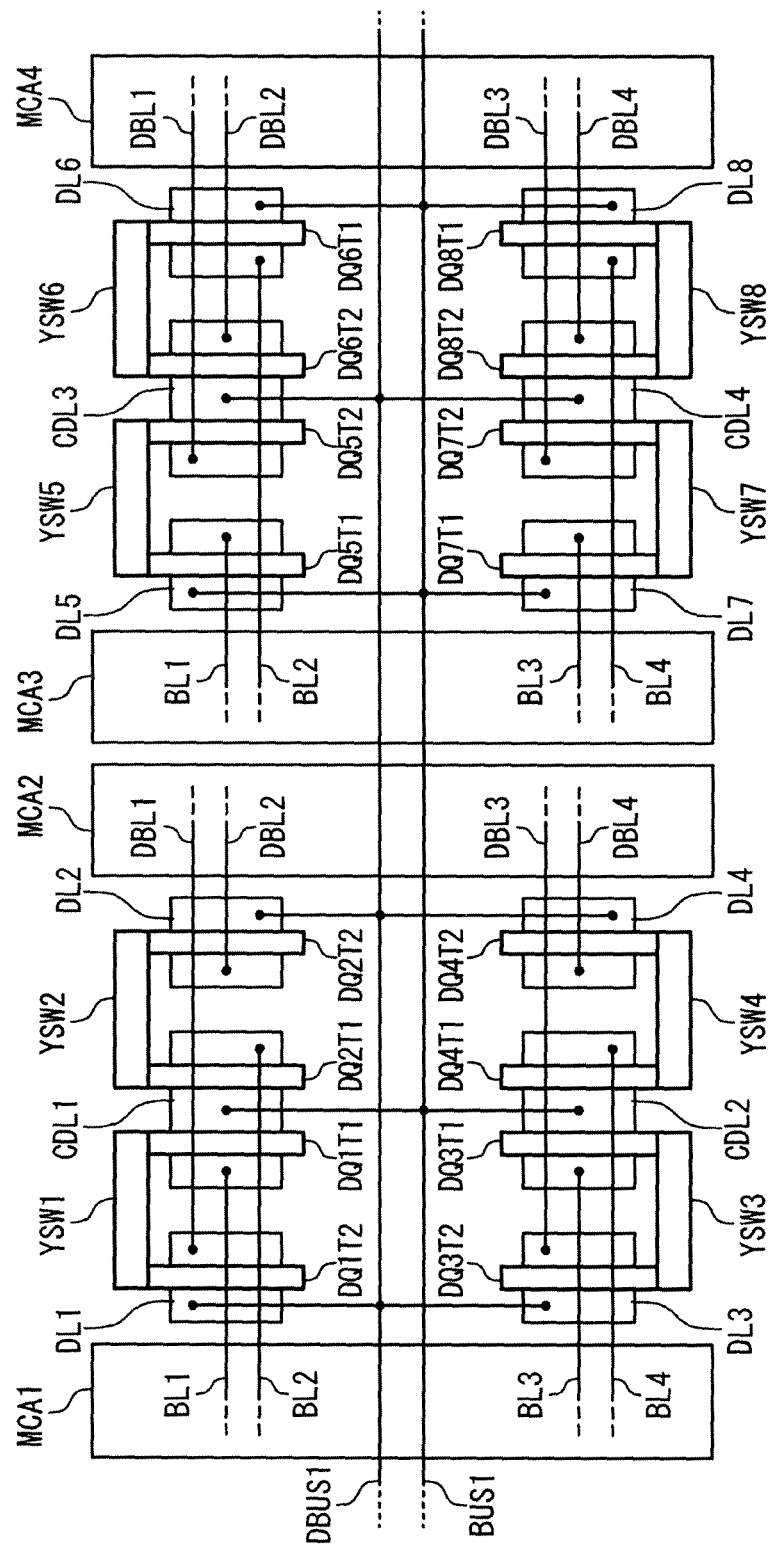
FIG. 5A is a plan view illustrating a semiconductor layout of a semiconductor integrated circuit device according to a first embodiment of the present invention.
Figure 5B:
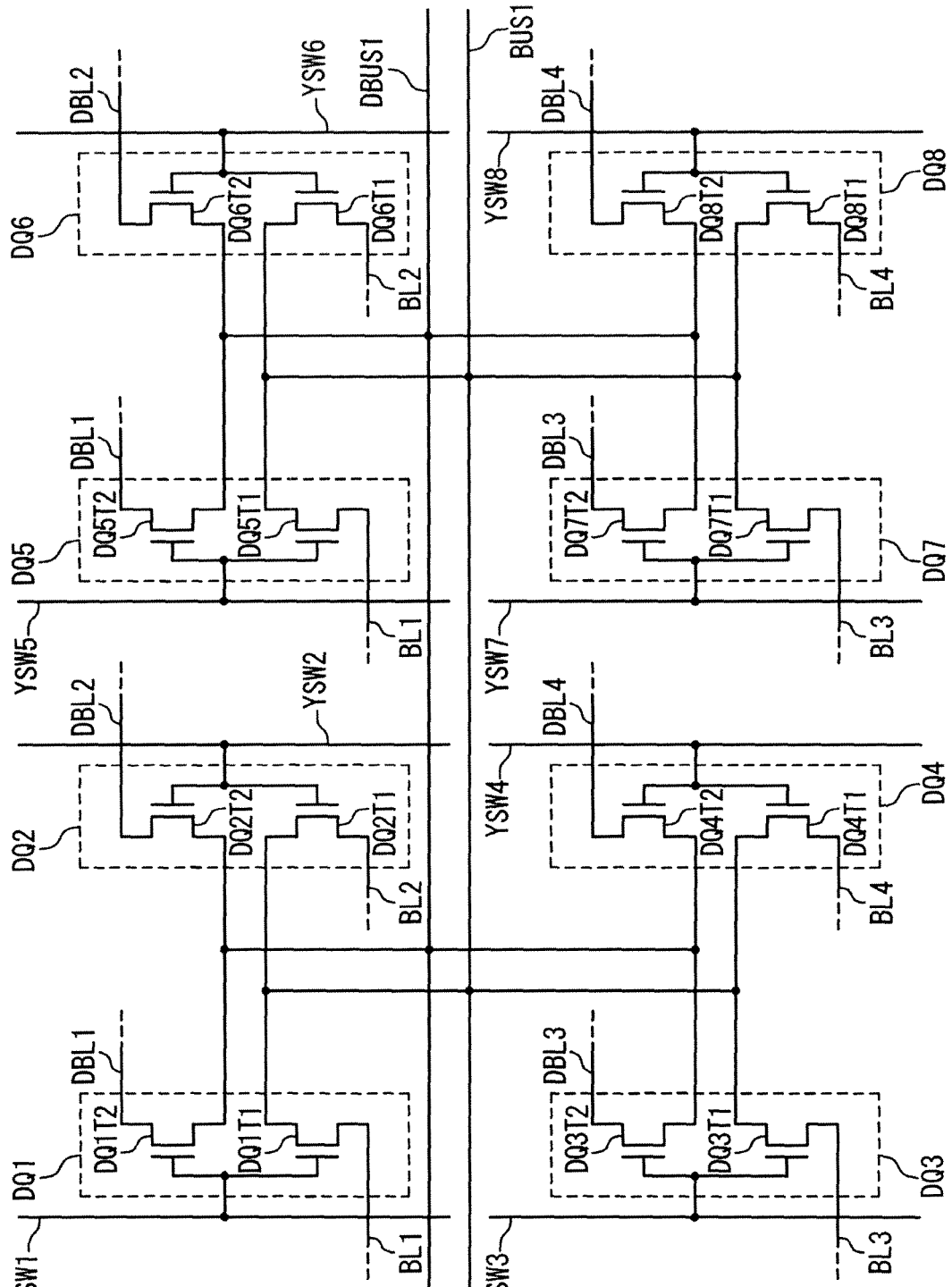
FIG. 5B is a circuit diagram illustrating a configuration of a circuit realized by the semiconductor layout of FIG. 5A.

FIG. 5A is a plan view illustrating a semiconductor layout of a semiconductor integrated circuit device according to a first embodiment of the present invention. FIG. 5B is a circuit diagram illustrating a configuration of a circuit realized by the semiconductor layout of FIG. 5A. First, the circuit diagram of FIG. 5B will be described.

Figure 1:
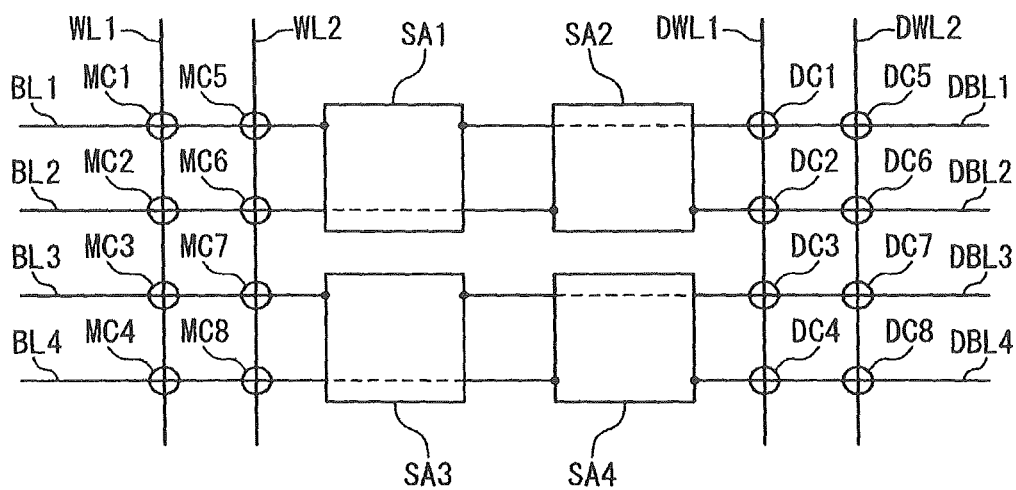
FIG. 1 is a layout diagram illustrating a semiconductor layout of an open bit sense amplifier in a general semiconductor memory device.
Figure 2:
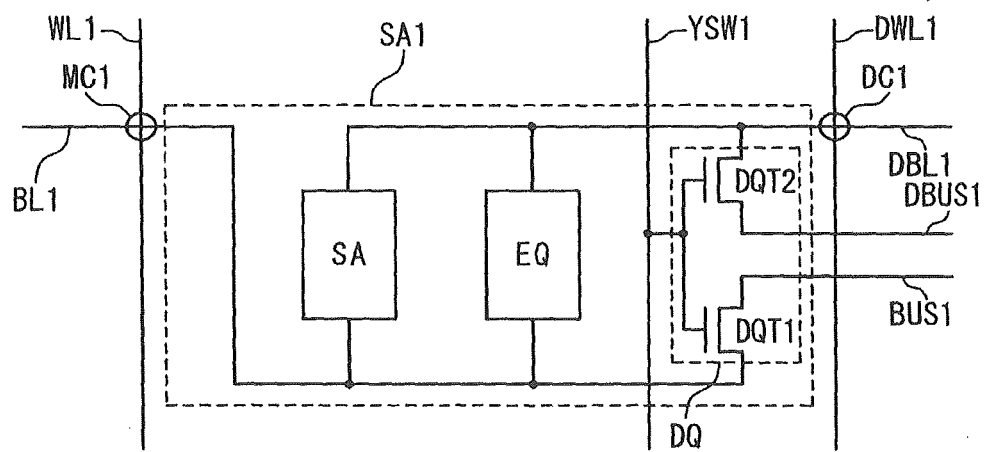
FIG. 2 is a block diagram illustrating wirings relating to a BUS signal, a dummy bus signal, and a column select signal in the sense amplifier in a simplified layout diagram of FIG. 1.
Figure 3:
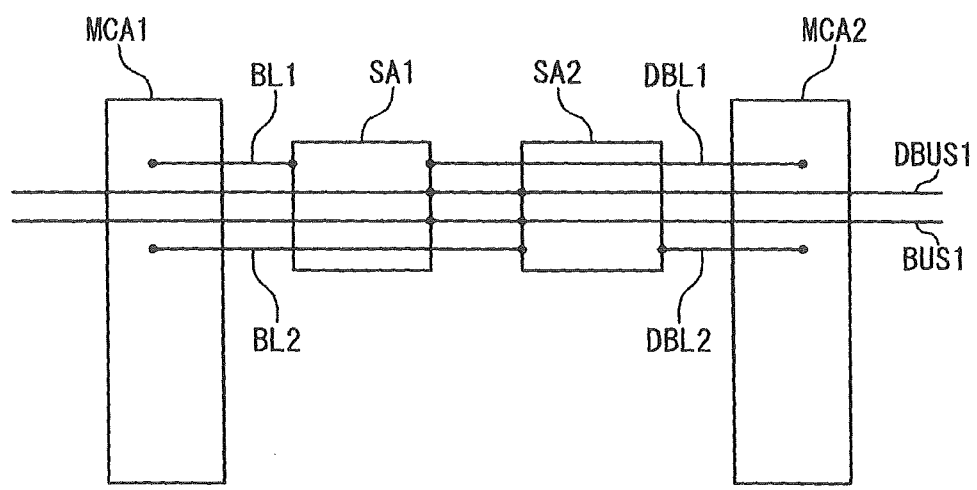
FIG. 3 is a block circuit diagram schematically illustrating an internal configuration of a first sense amplifier circuit in FIG. 2.
Figure 4A:
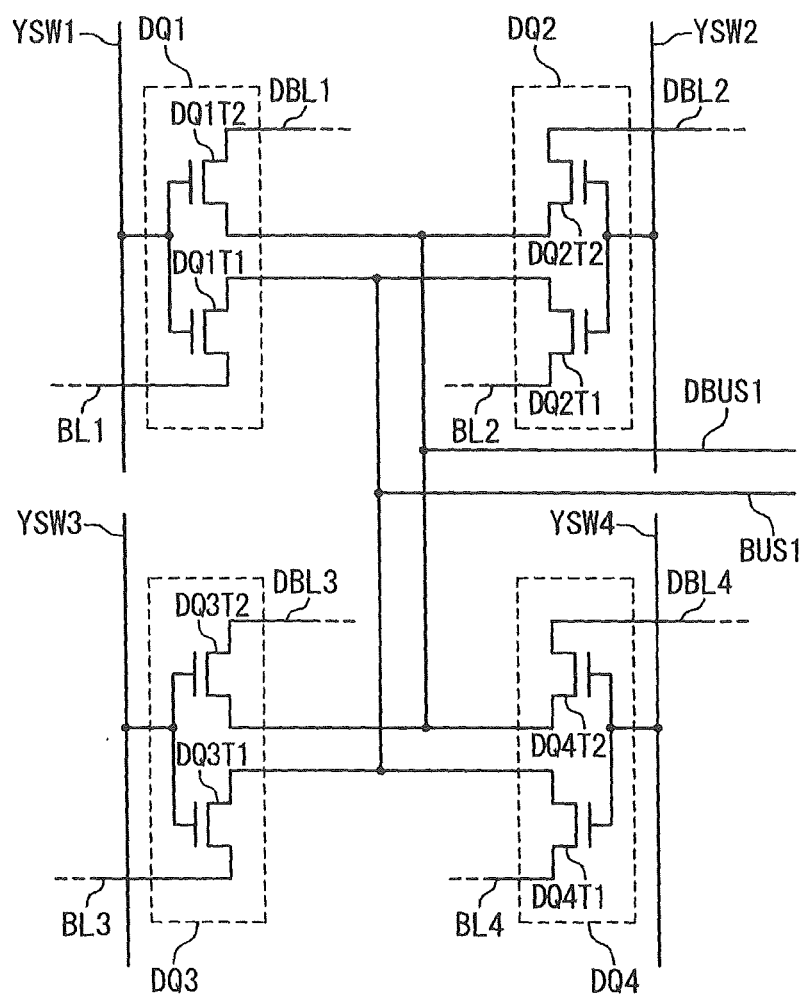
FIG. 4A is a circuit diagram illustrating a portion relating to first to fourth transfer circuits in first to fourth sense amplifier circuits extracted from the semiconductor memory device of FIG. 1.

The circuit diagram of FIG. 5B is equivalent to the combination of two of the circuit diagrams of FIG. 4A described as the related art. A configuration element in the circuit diagram of FIG. 5B will be described. The circuit of FIG. 5B includes first to eighth transfer circuits DQ1 to DQ8, first to eighth column select signal lines YSW1 to YSW8, a bus line BUS1, a dummy bus line DBUS1, first to fourth bit lines BL1 to BL4, and first to fourth dummy bit lines DBL1 to DBL4.

The first transfer circuit DQ1 includes a first transistor DQ1T1 and a second transistor DQ1T2. Likewise, the second to eighth transfer circuits DQ2 to DQ8 also include the first transistors DQ2T1 to DQ8T1, and the second transistors DQ8T1 to DQ8T2, respectively.

A coupling relationship of the constituent elements in the circuit of FIG. 5B will be described. The first column select signal line YSW1 is commonly coupled to gates of the first and second transistors DQ1T1 and DQ1T2 in the first transfer circuit DQ1. One of a source and a drain of the first transistor DQ1T1 in the first transfer circuit DQ1 is coupled to the first bit line BL1. The other of the source and the drain of the first transistor DQ1T1 in the first transfer circuit DQ1 is coupled to the first bus line BUS1. One of a source and a drain of the second transistor DQ1T2 in the first transfer circuit DQ1 is coupled to the first dummy bit line DBL1. The other of the source and the drain of the second transistor DQ1T2 in the first transfer circuit DQ1 is coupled to the first dummy bus line DBUS1.

Likewise, the second to eighth column select signal lines YSW2 to YSW8 are commonly coupled to gates of the first and second transistors DQ2T1 to DQ8T1 and DQ2T2 to DQ8T2 in the second to eighth transfer circuits DQ2 to DQ8, respectively. One of sources and drains of the first transistors DQ2T1 to DQ8T1 in the second to eighth transfer circuits DQ2 to DQ8 is coupled to the second to fourth bit lines BL2 to BL4, respectively. The other of the sources and the drains of the first transistors DQ2T1 to DQ8T1 in the second to eighth transfer circuits DQ2 to DQ8 is coupled to the bus line BUS1, respectively. One of a source and a drain of the second transistors DQ2T2 to DQ8T2 in the second to eighth transfer circuits DQ2 to DQ8 is coupled to the second to eighth dummy bit lines DBL2 to DBL4, respectively. The other of the source and the drain of the second transistors DQ2T2 to DQ8T2 in the second to eighth transfer circuits DQ2 to DQ8 is coupled to the first dummy bus line DBUS1, respectively.

Subsequently, the plan view of FIG. 5A will be described. The plan view of FIG. 5A illustrates the semiconductor layout corresponding to the circuit of FIG. 5B, and also illustrates first to fourth memory cell arrays MCA1 to MCA4.

The constituent elements of the semiconductor layout corresponding to the circuit of FIG. 5B, which are illustrated in FIG. 5A will be described. The semiconductor layout of FIG. 5A includes first to eighth diffusion layers DL1 to DL8, first to fourth common diffusion layers CDL1 to CDL4, the first to eighth column select signal lines YSW1 to YSW8, the bus line BUS1, the dummy bus line DBUS1, the first to fourth bit lines BL1 to BL4, and the first to fourth dummy bit lines DBL1 to DBL4.

The first diffusion layer DL1 is formed with the second transistor DQ1T2 in the first transfer circuit DQ1. In FIG. 5A, a gate portion of the second transistor DQ1T2 is indicated as the second transistor DQ1T2 in the first transfer circuit DQ1. Areas of the first diffusion layer DL1 at right and left ends thereof, which are expanded at both sides of the gate portion function as the source and the drain of the second transistor DQ1T2 in the first transfer circuit DQ1.

Likewise, the second to fourth diffusion layers DL2 to DL4 are formed with the second transistors DQ2T2 to DQ4T2 in the second to fourth transfer circuits DQ2 to DQ4, respectively. In FIG. 5A, gate portions of the second transistors DQ2T2 to DQ2T4 are indicated as the second transistors DQ1T2 to DQ2T4 in the second to fourth transfer circuits DQ2 to DQ4, respectively. Areas of the second to fourth diffusion layers DL2 to DL4 at right and left ends thereof, which are expanded at both sides of the gate portions function as the sources and the drains of the second transistors DQ2T2 to DQ4T2 in the second to fourth transfer circuits DQ2 to DQ4, respectively.

Also, the fifth diffusion layer DL5 is formed with the first transistor DQ5T1 in the fifth transfer circuit DQ5. In FIG. 5A, a gate portion of the first transistor DQ5T1 is indicated as the first transistor DQ5T1 in the fifth transfer circuit DQ5. Areas of the fifth diffusion layer DL5 at right and left ends thereof, which are expanded at both sides of the gate portion function as the source and the drain of the first transistor DQ5T1 in the fifth transfer circuit DQ5.

Likewise, the sixth to eighth diffusion layers DL6 to DL8 are formed with the first transistors DQ6T1 to DQ8T1 in the sixth to eighth transfer circuits DQ6 to DQ8, respectively. In FIG. 5A, gate portions of the first transistors DQ6T1 to DQ8T1 are indicated as the first transistors DQ6T1 to DQ8T1 in the sixth to eighth transfer circuits DQ6 to DQ8, respectively. Areas of the sixth to eighth diffusion layers DL6 to DL8 at right and left ends thereof, which are expanded at both sides of those gate portions function as the sources and the drains of the first transistors DQ6T1 to DQ8T1 in the sixth to eighth transfer circuits DQ6 to DQ8, respectively.

The first transistors DQ1T1 and DQ2T1 in the first and second transfer circuits DQ1 and DQ2 are formed on the left side and the right side of the first common diffusion layer CDL1, respectively. In FIG. 5A, as the first transistors DQ1T1 and DQ2T1 in the first and second transfer circuits DQ1 and DQ2, the respective gate portions formed on left and right are indicated. The first common diffusion layer CDL1 is divided into three pieces by those left and right gate portions. The left area of the first common diffusion layer CDL1 in FIG. 5A is coupled with the first bit line BL1, and this area represents one of the source and the drain of the first transistor DQ1T1 in the first transfer circuit DQ1, which is described in FIG. 5B. The right area of the first common diffusion layer CDL1 in FIG. 5A is coupled with the first bit line BL2, and this area represents one of the source and the drain of the first transistor DQ2T1 in the first transfer circuit DQ2, which is described in FIG. 5B. A center area of the first common diffusion layer CDL1 interposed between those gate portions is coupled with the first bus line BUS1. The center area functions as the other of the source and the drain of the first transistor DQ1T1 in the first transfer circuit DQ1, which is described with reference to FIG. 5B while functioning as the other of the source and the drain of the first transistor DQ2T1 in the second transfer circuit DQ2. That is, the center area interposed between those two gate portions represents the source or the drain shared by the first transistors DQ1T1 and DQ2T1 in the first and second transfer circuits DQ1 and DQ2.

Likewise, the first transistors DQ3T1 and DQ4T1 in the third and fourth transfer circuits DQ3 and DQ4 are formed on the left side and the right side of the second common diffusion layer CDL2, respectively. In FIG. 5A, as the first transistors DQ3T1 and DQ4T1 in the third and fourth transfer circuits DQ3 and DQ4, the respective gate portions formed on left and right are indicated. The second common diffusion layer CDL2 is divided into three pieces by those left and right gate portions. The left area of the second common diffusion layer CDL2 in FIG. 5A is coupled with the third bit line BL3, and this area represents one of the source and the drain of the first transistor DQ3T1 in the third transfer circuit DQ3, which is described in FIG. 5B. The right area of the second common diffusion layer CDL2 in FIG. 5A is coupled with the fourth bit line BL4, and this area represents one of the source and the drain of the first transistor DQ4T1 in the fourth transfer circuit DQ4, which is described in FIG. 5B. A center area of the second common diffusion layer CDL2 interposed between those gate portions is coupled with the bus line BUS1. The center area functions as the other of the source and the drain of the first transistor DQ3T1 in the third transfer circuit DQ3, which is described with reference to FIG. 5B while functioning as the other of the source and the drain of the first transistor DQ4T1 in the fourth transfer circuit DQ4. That is, the center area interposed between those two gate portions represents the source or the drain shared by the first transistors DQ3T1 and DQ4T1 in the third and fourth transfer circuits DQ3 and DQ4.

Also, the second transistors DQ5T2 and DQ6T2 in the fifth and sixth transfer circuits DQ5 and DQ6 are formed on the left side and the right side of the third common diffusion layer CDL3, respectively. In FIG. 5A, as the second transistors DQ5T2 and DQ6T2 in the fifth and sixth transfer circuits DQ5 and DQ6, the respective gate portions formed on left and right are indicated. The third common diffusion layer CDL3 is divided into three pieces by those left and right gate portions. The left area of the third common diffusion layer CDL3 in FIG. 5A is coupled with the first dummy bit line DBL1, and this area represents one of the source and the drain of the second transistor DQ5T2 in the fifth transfer circuit DQ5, which is described in FIG. 5B. The right area of the third common diffusion layer CDL3 in FIG. 5A is coupled with the second dummy bit line DBL2, and this area represents one of the source and the drain of the second transistor DQ6T2 in the sixth transfer circuit DQ6, which is described in FIG. 5B. A center area of the third common diffusion layer CDL3 interposed between those gate portions is coupled with the dummy bus line DBUS1. The center area functions as the other of the source and the drain of the second transistor DQ5T2 in the fifth transfer circuit DQ5, which is described with reference to FIG. 5B while functioning as the other of the source and the drain of the second transistor DQ6T2 in the sixth transfer circuit DQ6. That is, the center area interposed between those two gate portions represents the source or the drain shared by the second transistors DQ5T2 and DQ6T2 in the fifth and sixth transfer circuits DQ5 and DQ6.

Likewise, the second transistors DQ7T2 and DQ8T2 in the seventh and eighth transfer circuits DQ7 and DQ8 are formed on the left side and the right side of the fourth common diffusion layer CDL4, respectively. In FIG. 5A, as the second transistors DQ7T2 and DQ8T2 in the seventh and eighth transfer circuits DQ7 and DQ8, the respective gate portions formed on left and right are indicated. The fourth common diffusion layer CDL4 is divided into three pieces by those left and right gate portions. The left area of the fourth common diffusion layer CDL4 in FIG. 5A is coupled with the third dummy bit line DBL3, and this area represents one of the source and the drain of the second transistor DQ7T2 in the seventh transfer circuit DQ7, which is described in FIG. 5B. The right area of the fourth common diffusion layer CDL4 in FIG. 5A is coupled with the fourth dummy bit line DBL4, and this area represents one of the source and the drain of the second transistor DQ8T2 in the eighth transfer circuit DQ8, which is described in FIG. 5B. A center area of the fourth common diffusion layer CDL4 interposed between those gate portions is coupled with the dummy bus line DBUS1. The center area functions as the other of the source and the drain of the second transistor DQ7T2 in the seventh transfer circuit DQ7, which is described with reference to FIG. 5B while functioning as the other of the source and the drain of the second transistor DQ8T2 in the eighth transfer circuit DQ8. That is, the center area interposed between those two gate portions represents the source or the drain shared by the second transistors DQ7T2 and DQ8T2 in the seventh and eighth transfer circuits DQ7 and DQ8.

Figure 4B:
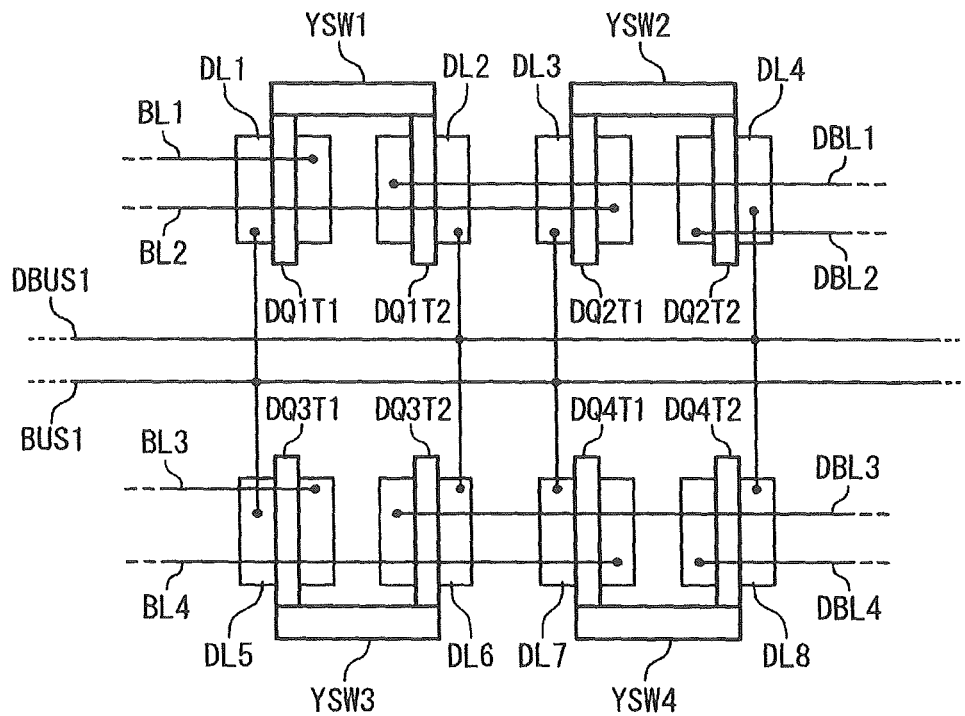
FIG. 4B is a plan view illustrating a semiconductor layout according to the circuit diagram of FIG. 4A.
Figure 4C:
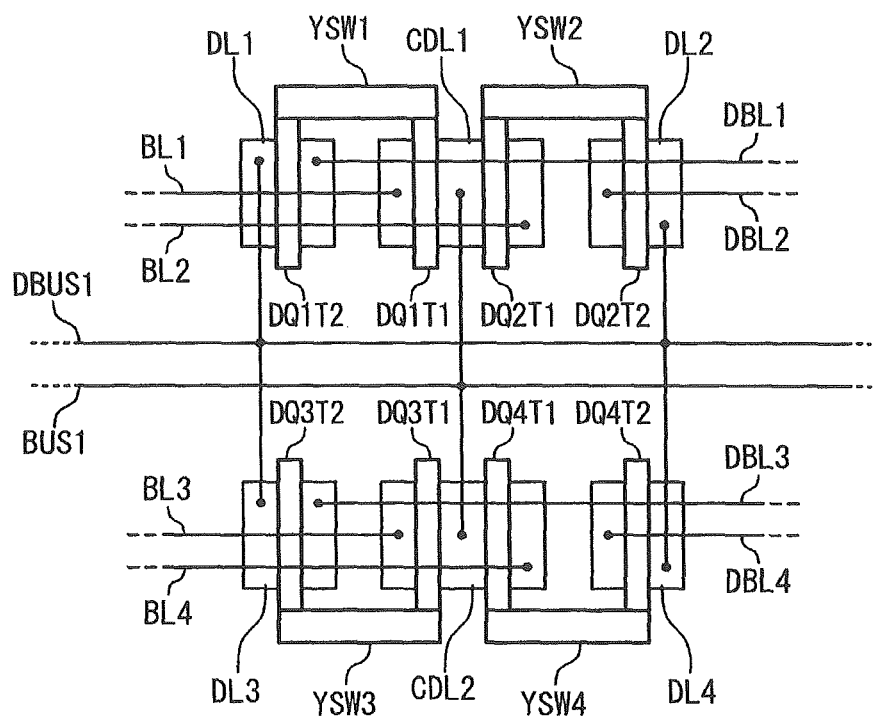
FIG. 4C is a plan view illustrating a semiconductor layout in which the semiconductor layout of FIG. 4B is improved by commondizing diffusion layers of partial transistors.

Thus, the two diffusion layers used in the related art illustrated in FIG. 4B are replaced with the common diffusion layer illustrated in FIG. 5A, thereby enabling the circuit area to be saved. That is, in the example of FIG. 5A, the circuit area can be saved by twice the width of the source or the drain in the transfer circuit, and twice a distance between the diffusion layers.

A description will be given of the positional relationships and coupling relationships of the constituent elements in the semiconductor layout of FIG. 5A. The first common diffusion layer CDL1 is arranged between the first and second diffusion layers DL1 and DL2 in the lateral direction of FIG. 5A. Likewise, the second common diffusion layer CDL2 is arranged between the third and fourth diffusion layers DL3 and DL4 in the lateral direction of FIG. 5A. A first block having the first diffusion layer DL1, the first common diffusion layer CDL1, and the second diffusion layer DL2, and a second block having the third diffusion layer DL3, the second common diffusion layer CDL1, and the fourth diffusion layer DL4 are aligned in the longitudinal direction of FIG. 5A. The first block and the second block are arranged between the first and second memory cell arrays MCA1 and MCA2 in the lateral direction of FIG. 5A.

The third common diffusion layer CDL3 is arranged between the fifth and sixth diffusion layers DL5 and DL6 in the lateral direction of FIG. 5A. Likewise, the fourth common diffusion layer CDL4 is arranged between the seventh and eighth diffusion layers DL7 and DL8 in the lateral direction of FIG. 5A. A third block having the fifth diffusion layer DL5, the third common diffusion layer CDL3, and the sixth diffusion layer DL6, and a fourth block having the seventh diffusion layer DL7, the fourth common diffusion layer CDL4, and the eighth diffusion layer DL8 are aligned in the longitudinal direction of FIG. 5A. The third block and the fourth block are arranged between the third and fourth memory cell arrays MCA3 and MCA4 in the lateral direction of FIG. 5A.

In other words, when attention is paid to the first and third common diffusion layers CDL1 and CDL3, the first memory cell array MCA1, the first diffusion layer DL1, the first common diffusion layer CDL1, the second diffusion layer DL2, the second memory cell array MCA2, the third memory cell array MCA3, the fifth diffusion layer DL5, the third common diffusion layer CDL3, the sixth diffusion layer DL6, and the fourth memory cell array MCA4 are aligned in the stated order in one direction. Likewise, when attention is paid to the second and fourth common diffusion layers CDL2 and CDL4, the first memory cell array MCA1, the third diffusion layer DL3, the second common diffusion layer CDL2, the fourth diffusion layer DL4, the second memory cell array MCA2, the third memory cell array MCA3, the seventh diffusion layer DL7, the fourth common diffusion layer CDL4, the eighth diffusion layer DL8, and the fourth memory cell array MCA4 are aligned in the stated order in one direction.

The first column select signal line YSW1 is coupled to a gate portion of the first diffusion layer DL1 and a left gate portion of the first common diffusion layer CDL1. The second column select signal line YSW2 is coupled to a gate portion of the second diffusion layer DL2 and a right gate portion of the first common diffusion layer CDL1. The third column select signal line YSW3 is coupled to a gate portion of the third diffusion layer DL3 and a left gate portion of the second common diffusion layer CDL2. The fourth column select signal line YSW4 is coupled to a gate portion of the fourth diffusion layer DL4 and a right gate portion of the second common diffusion layer CDL2. The fifth column select signal line YSW5 is coupled to a gate portion of the fifth diffusion layer DL5 and a left gate portion of the third common diffusion layer CDL3. The sixth column select signal line YSW6 is coupled to a gate portion of the sixth diffusion layer DL5 and a right gate portion of the third common diffusion layer CDL3. The seventh column select signal line YSW7 is coupled to a gate portion of the seventh diffusion layer DL7 and a left gate portion of the fourth common diffusion layer CDL4. The eighth column select signal line YSW8 is coupled to a gate portion of the eighth diffusion layer DL8 and a right gate portion of the fourth common diffusion layer CDL4.

The bus line BUST is coupled to the respective left areas of the fifth and seventh diffusion layers DL5 and DL7, and the respective right areas of the sixth and eighth diffusion layers DL6 and DL8, as well as the respective center areas of the first and second common diffusion layers CDL1 and CDL2 described above. The dummy bus line DBUS1 is coupled to the respective left areas of the fifth and third diffusion layers DL1 and DL3, and the respective right areas of the second and fourth diffusion layers DL2 and DL4, as well as the respective center areas of the third and fourth common diffusion layers CDL3 and CDL4 described above.

The first bit line BL1 is coupled to the right area of the fifth diffusion layer DL5, and the first and third memory cell arrays MCA1 and MCA3, as well as the left area of the first common diffusion layer CDL1 described above. The second bit line BL2 is coupled to the left area of the sixth diffusion layer DL6, and the first and third memory cell arrays MCA1 and MCA3, as well as the right area of the first common diffusion layer CDL1 described above. The third bit line BL3 is coupled to the right area of the seventh diffusion layer DL7, and the first and third memory cell arrays MCA1 and MCA3, as well as the left area of the second common diffusion layer CDL2 described above. The fourth bit line BL4 is coupled to the left area of the eighth diffusion layer DL8, and the first and third memory cell arrays MCA1 and MCA3, as well as the right area of the second common diffusion layer CDL2 described above.

The first dummy bit line DBL1 is coupled to the right area of the first diffusion layer DL1, and the second and fourth memory cell arrays MCA2 and MCA4, as well as the left area of the third common diffusion layer CDL3 described above. The second dummy bit line DBL2 is coupled to the left area of the second diffusion layer DL2, and the second and fourth memory cell arrays MCA2 and MCA4, as well as the right area of the third common diffusion layer CDL3 described above. The third dummy bit line DBL3 is coupled to the right area of the third diffusion layer DL3, and the second and fourth memory cell arrays MCA2 and MCA4, as well as the left area of the fourth common diffusion layer CDL4 described above. The fourth dummy bit line DBL4 is coupled to the left area of the fourth diffusion layer DL4, and the second and fourth memory cell arrays MCA2 and MCA4, as well as the right area of the fourth common diffusion layer CDL4 described above.

A description will be given of the operation of the semiconductor integrated circuit device according to the first embodiment of the present invention. Even if the semiconductor layout is changed from that of the related art illustrated in FIG. 4A to that of this embodiment, the semiconductor integrated circuit device functions as the dynamic semiconductor storage device without any change.

In addition, this embodiment has such an advantage that a total of the areas of various diffusion layers coupled to the bus line BUS1 and the dummy bus line DBUS1 is equal thereto. Accordingly, the bus line BUS1 and the dummy bus lien DBUS1 are balanced with each other in the capacitive load exerted on the respective lines. Thus, according to this embodiment, saving of the circuit area, resultant saving of the manufacturing costs, and balancing of the capacitive loads on the paired wirings can be performed at the same time.

Now, attention is paid to antisymmetry in the semiconductor layout illustrated in FIG. 5A. In the semiconductor layout illustrated in FIG. 5A, portions relating to the first and second memory cell arrays MCA1 and MCA2 are called "first block". Likewise, in the semiconductor layout illustrated in FIG. 5A, portions relating to the third and fourth memory cell arrays MCA3 and MCA4 are called "second block". That is, the first block includes the first and second memory cell arrays MCA1 and MCA2, the first to fourth transfer circuits DQ1 to DQ4, the first to fourth column select signal lines YSW1 to YSW4, the eight transistors DQ1T1, DQ1T2, DQ2T1, DQ2T2, DQ3T1, DQ3T2, DQ4T1, and DQ4T2, and the respective wirings coupling those components to each other. Likewise, the second block includes the third and fourth memory cell arrays MCA3 and MCA4, the fifth to eighth transfer circuits DQ5 to DQ8, the fifth to eighth column select signal lines YSW5 to YSW8, the eight transistors DQ5T1, DQ5T2, DQ6T1, DQ6T2, DQ7T1, DQ7T2, DQ8T1, and DQ8T2, and the respective wirings coupling those components to each other.

In this situation, the wiring coupling the bus line BUS1 with the first block is called "first wiring". Likewise, the wiring coupling the bus line BUS1 with the second block is called "second wiring". The first wiring couples the bus line BUS1 with the four transistors DQ1T1, DQ2T1, DQ3T1, and DQ4T1. Since those four transistors are formed in the two common diffusion layers CDL1 and CDL2, a total number of the first wirings is two. The second wiring couples the bus line BUS1 with the four transistors DQ5T1, DQ6T1, DQ7T1, and DQ8T1. Since those four transistors are formed in the respective four diffusion layers DL5 and DL8, a total number of the second wirings is four. Thus, the first wirings and the second wirings are different in number from each other.

Also, the wiring coupling the dummy bus line DBUS1 with the first block is called "third wiring". Likewise, the wiring coupling the bus line BUS1 with the second block is called "fourth wiring". The third wiring couples the dummy bus line DBUS1 with the four transistors DQ1T2, DQ2T2, DQ3T2, and DQ4T2. Since those four transistors are formed in the respective four diffusion layers DL1 to DL4, a total number of the third wirings is four. The fourth wiring couples the dummy bus line DBUS1 with the four transistors DQ5T2, DQ6T2, DQ7T2, and DQ8T2. Since those four transistors are formed in the two common diffusion layers CDL3 and CDL4, a total number of the fourth wirings is two. Thus, the third wirings and the fourth wirings are different in number from each other.

Thus, in the semiconductor layout according to this embodiment illustrated in FIG. 5A, the total number of the first to fourth wirings coupling the first block and the second block with the bus line bUS1 and the dummy bus line DBUS1 has an antisymmetric relationship. In other words, in the semiconductor integrated circuit device according to this embodiment, the two blocks having the wirings with the antisymmetric relationship are combined together into one constituent unit, to thereby eliminate the capacitive unbalance between the complemented bus lines. In this situation, the constituent units are combined together innumerably, thereby enabling a large-capacity storage device to be formed.

Second Embodiment

Figure 6:
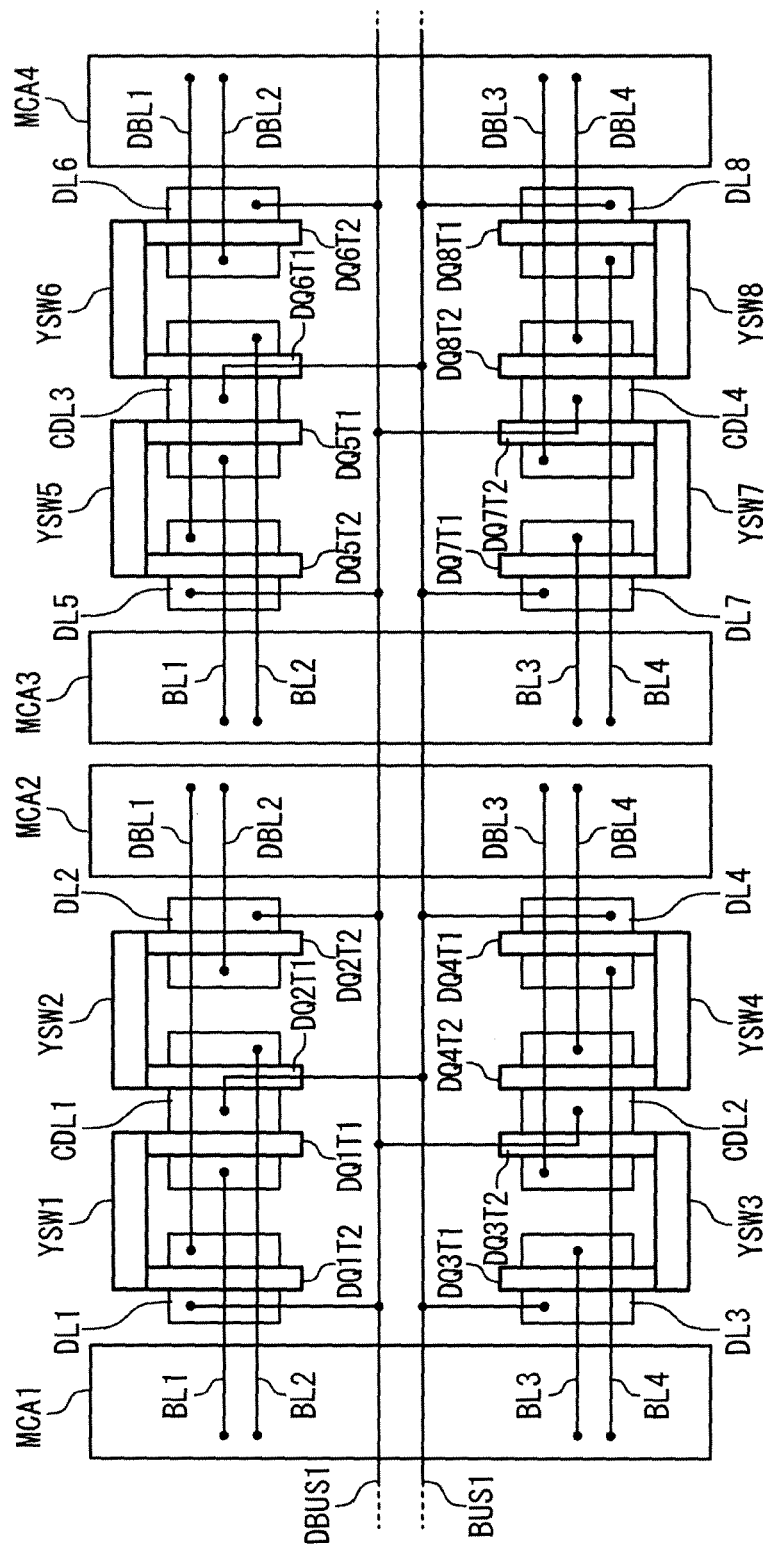
FIG. 6 is a plan view illustrating a semiconductor layout of a semiconductor integrated circuit device according to a second embodiment of the present invention.

FIG. 6 is a plan view illustrating a semiconductor layout of a semiconductor integrated circuit device according to a second embodiment of the present invention. A circuit realized by the semiconductor layout of FIG. 6 is identical with that in the first embodiment of the present invention illustrated in FIG. 5B, and therefore a more detailed description thereof will be omitted. The semiconductor layout of FIG. 6 is equivalent to the semiconductor layout according to the first embodiment of the present invention illustrated in FIG. 5A, which is modified as follows. That is, the positions of the first and second transistors DQ3T1 to DQ6T1 and DQ3T2 to DQ6T2 in the respective third to sixth transfer circuits DQ3 to DQ6 are replaced with each other.

As an example, the position replacement of the first and second transistors DQ3T1 and DQ3T2 in the third transfer circuit DQ3 will be described in more detail. The first transistor DQ3T1 in the third transfer circuit DQ3 is formed on the left side of the second common diffusion layer CDL2 in the first embodiment. Likewise, the second transistor DQ3T2 in the third transfer circuit DQ3 is formed in the third diffusion layer DL3 in the first embodiment. However, in this embodiment, the first transistor DQ3T1 in the third transfer circuit DQ3 is formed in the third diffusion layer DL3. Likewise, the second transistor DQ3T2 is formed on the left side of the second common diffusion layer CDL2.

With this change, in this embodiment, as compared with the case in the first embodiment according to the present invention, the coupling of one of the source and the drain of the first transistor DQ3T1 in the third transfer circuit DQ3 with the third bit line BL3 is also changed. That is, the third bit line BL3, which is coupled to the left side of the second common diffusion layer CDL2 in the first embodiment, is coupled to the right side of the third diffusion layer DL3 in this embodiment.

Likewise, the coupling of one of the source and the drain of the second transistor DQ3T2 in the third transfer circuit DQ3 with the third bit line BL3 is also changed. That is, the third dummy bit line DBL3, which is coupled to the right side of the third diffusion layer DL3 in the first embodiment, is coupled to the left side of the second common diffusion layer in this embodiment.

Furthermore, with those changes, in this embodiment, as compared with the first embodiment of the present invention, the coupling of the third transfer circuit DQ3 with the bus line BUS1 is also changed. That is, the bus line BUS1, which is coupled to the center portion of the second common diffusion layer CDL2 in the first embodiment of the present invention, is coupled to the left side of the third diffusion layer DL3 in this embodiment.

Likewise, with those changes, in this embodiment, as compared with the first embodiment of the present invention, the coupling of the third transfer circuit DQ3 with the dummy bus line DBUS1 is also changed. That is, the dummy bus line DBUS1, which is coupled to the left side of the third common diffusion layer DL3 in the first embodiment of the present invention, is coupled to the center portion of the second common diffusion layer CDL2 in this embodiment.

Even if the coupling destinations of both ends of the third column select signal line YSW3 are replaced with other coupling destinations, the shape and arrangement thereof are not changed.

As with the third transfer circuit DQ3 described above, in this embodiment, as compared with the first embodiment of the present invention, the positions of the first and second transistors DQ4T1 to DQ6T1 and DQ4T2 to DQ6T2 in the respective fourth to sixth transfer circuits DQ4 to DQ6 are changed. Also, with those changes, in this embodiment, as compared with the first embodiment of the present invention, the coupling positions of the fourth to sixth bit lines BL4 to BL6, the fourth to sixth dummy bit lines DBL4 to DBL6, the bus line BUS1, and the dummy bus line DBUS1 are also changed.

The other constituent elements, coupling relationships, and operation of the semiconductor integrated circuit device according to this embodiment are identical with those in the first embodiment of the present invention, and therefore a more detailed description thereof will be omitted.

According to this embodiment, the following advantages are obtained in addition to the advantages obtained in the first embodiment of the present invention. Referring to FIG. 6, the first and second memory cell arrays MCA1 and MCA2, the first to fourth transfer circuits DQ1 to DQ4, and the wirings pertaining to those constituent elements are called "first configuration unit". Likewise, the third and fourth memory cell arrays MCA3 and MCA4, the fifth to eighth transfer circuits DQ5 to DQ8, and the wirings pertaining to those constituent elements are called "second configuration unit". In this situation, the first and second constituent units are completely identical in configuration with each other. Accordingly, the semiconductor layout according to this embodiment can be expanded to any sizes by merely combining a plurality of only the first or second constituent units together.

However, from a different viewpoint, the semiconductor integrated circuit device according to this embodiment also has the same antisymmetry as that in the first embodiment of the present invention. That is, among the first configuration unit, a portion pertaining to the four transistors DQ1T1, DQ1T2, DQ2T1, and DQ2T2 is treated as the first block. Also, a portion pertaining to the four transistors DQ3T1, DQ3T2, DQ4T1, and DQ4T2 is treated as the second block.

In this case, as the first wiring that couples the bus line BUS1 with the first block, there is only one wiring coupled to one common diffusion layer CDL1. Also, as the second wirings that couple the bus line BUS1 with the second block, there are two wirings coupled to the two diffusion layers DL1 and DL2. Thus, the first wiring and the second wirings are different in number from each other.

Likewise, as the third wirings that couple the dummy bus line DBUS1 with the first block, there are two wiring coupled to the two diffusion layers DL3 and DL4. Also, as the fourth wiring that couples the dummy bus line DBUS1 with the second block, there is only one wiring coupled to the one common diffusion layer CDL2. Thus, the third wirings and the fourth wiring are different in number from each other.

Thus, even in the semiconductor layout illustrated in FIG. 6, a total number of the first to fourth wirings that couple the first block and the second block to the bus line BUS1 and the dummy bus line DBUS1 has an antisymmetric relationship. Accordingly, even in this embodiment, the same advantages as those in the first embodiment of the present invention are obtained.

Third Embodiment

Figure 7:
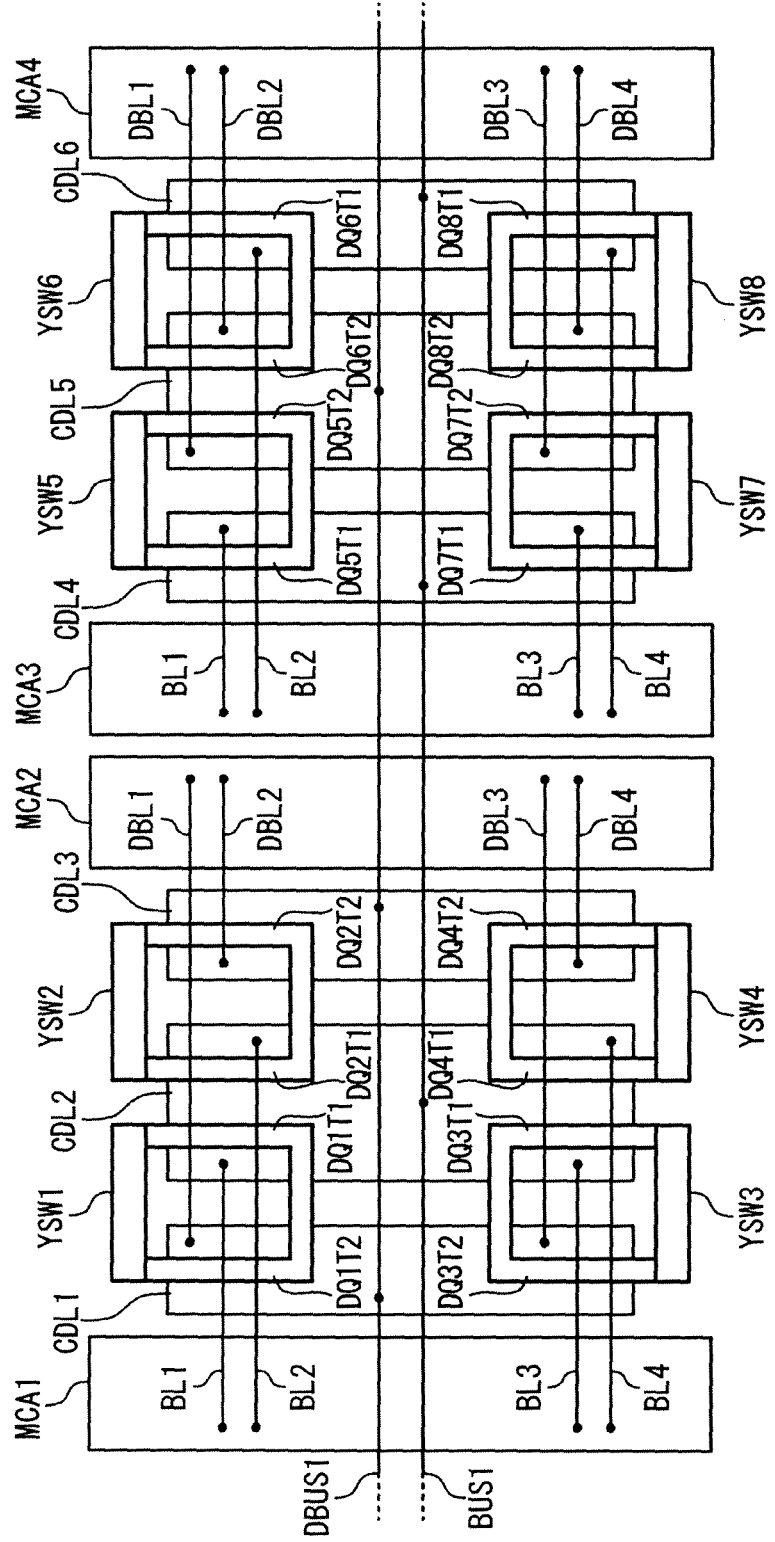
FIG. 7 is a plan view illustrating a semiconductor layout of a semiconductor integrated circuit device according to a third embodiment of the present invention.

FIG. 7 is a plan view illustrating a semiconductor layout of a semiconductor integrated circuit device according to a third embodiment of the present invention. A circuit realized by the semiconductor layout of FIG. 7 is identical with that in the first embodiment of the present invention illustrated in FIG. 5B, and therefore a more detailed description thereof will be omitted. The semiconductor layout of FIG. 7 is equivalent to the semiconductor layout according to the first embodiment of the present invention illustrated in FIG. 5A, which is modified as follows. That is, in FIG. 5A, the two diffusion layers aligned in the longitudinal direction such as the first and third diffusion layers DL1 and DL3, or the second and fourth diffusion layers DL2 and DL4, are shared and changed into one common diffusion layer. Also, referring to FIG. 5A, the two common diffusion layers aligned in the longitudinal direction such as the first and second common diffusion layers CDL1 and CDL2 are further shared and changed into one common diffusion layer.

As a first example, a description will be given of the first common diffusion layer CDL1 in FIG. 7, which is obtained by sharing the first and fourth diffusion layers DL1 and DL4 in FIG. 5A in detail. The second transistor DQ1T2 in the first transfer circuit DQ1, which is formed in the first diffusion layer DL1 in FIG. 5A, is formed in the first common diffusion layer CDL1 in FIG. 7. Further, the second transistor DQ3T2 in the third transfer circuit DQ3, which is formed in the third diffusion layer DL3 in FIG. 5A, is formed in the first common diffusion layer CDL1 in FIG. 7.

In this example, the gate portion of the second transistor DQ1T2 in the first transfer circuit DQ1 is L-shaped. One end of the L-shaped gate portion is protruded upward from the first common diffusion layer CDL1 in FIG. 7. Also, the other end of the L-shaped gate portion is protruded rightward from the first common diffusion layer CDL1 in FIG. 7.

As a result, an upper right area of the first common diffusion layer CDL1 in FIG. 7 is isolated by the L-shaped gate portion. The upper right area operates as one of the source and the drain of the second transistor DQ1T2 in the first transfer circuit DQ1, and is coupled with the first dummy bit line DBL1.

Likewise, the gate portion of the second transistor DQ3T2 in the third transfer circuit DQ3 is also L-shaped. One end of the L-shaped gate portion is protruded downward from the first common diffusion layer CDL1 in FIG. 7. Also, the other end of the L-shaped gate portion is protruded rightward from the first common diffusion layer CDL1 in FIG. 7.

As a result, a lower right area of the first common diffusion layer CDL1 in FIG. 7 is isolated by the L-shaped gate portion. The lower right area operates as one of the source and the drain of the second transistor DQ3T2 in the third transfer circuit DQ3, and is coupled with the third dummy bit line DBL3.

The other area of the first common diffusion layer CDL1 operates the other of the source and the drain of the second transistor DQ1T2 in the first transfer circuit DQ1. The other area of the first common diffusion layer CDL1 also operates as the other of the source and the drain of the second transistor DQ3T2 in the third transfer circuit DQ3. This area is called "common area". This common area is coupled with the dummy bus line DBUS1.

As with the above-described first example, the second and fourth diffusion layers DL2 and DL4 in FIG. 5A are shared to obtain the third common diffusion layer CDL3 in FIG. 7. The fifth and seventh diffusion layers DL5 and DL7 in FIG. 5A are shared to obtain the fourth common diffusion layer CDL4 in FIG. 7. The sixth and eighth diffusion layers DL6 and DL8 in FIG. 5A are shared to obtain the sixth common diffusion layer CDL6 in FIG. 7.

The common area of the third common diffusion layer CDL3 is coupled with the dummy bus line DBUS1 as with the first common diffusion layer CDL1. On the other hand, the respective common areas of the fourth and sixth common diffusion layers CDL4 and CDL6 are coupled with the bus line BUS1.

As a second example, a description will be given of the second common diffusion layer CDL2 in FIG. 7, which is obtained by sharing the first and second common diffusion layers CDL1 and CDL2 in FIG. 5A in detail. The first transistors DQ1T1 and DQ2T1 in the respective first and second transfer circuits DQ1 and DQ2, which are formed in the first common diffusion layer CDL1 in FIG. 5A, is formed in the second common diffusion layer CDL2 in FIG. 7. Further, the first transistors DQ3T1 and DQ4T1 in the respective third and fourth transfer circuit DQ3 and DQ4, which are formed in the second common diffusion layer CDL2 in FIG. 5A, are also formed in the second common diffusion layer CDL2 in FIG. 7.

In this example, the gate portion of the first transistor DQ1T1 in the first transfer circuit DQ1 is L-shaped. One end of the L-shaped gate portion is protruded upward from the second common diffusion layer CDL2 in FIG. 7. Also, the other end of the L-shaped gate portion is protruded leftward from the second common diffusion layer CDL2 in FIG. 7.

As a result, an upper left area of the second common diffusion layer CDL2 in FIG. 7 is isolated by the L-shaped gate portion. The upper left area operates as one of the source and the drain of the first transistor DQ1T1 in the first transfer circuit DQ1, and is coupled with the first bit line BL1.

Likewise, the gate portion of the first transistor DQ2T1 in the second transfer circuit DQ2 is also L-shaped. One end of the L-shaped gate portion is protruded upward from the second common diffusion layer CDL2 in FIG. 7. Also, the other end of the L-shaped gate portion is protruded rightward from the second common diffusion layer CDL2 in FIG. 7.

As a result, an upper right area of the second common diffusion layer CDL2 in FIG. 7 is isolated by the L-shaped gate portion. The upper right area operates as one of the source and the drain of the first transistor DQ2T1 in the second transfer circuit DQ2, and is coupled with the second bit line BL2.

Likewise, the gate portion of the first transistor DQ3T1 in the third transfer circuit DQ3 is also L-shaped. One end of the L-shaped gate portion is protruded downward from the second common diffusion layer CDL2 in FIG. 7. Also, the other end of the L-shaped gate portion is protruded leftward from the second common diffusion layer CDL2 in FIG. 7.

As a result, a lower left area of the second common diffusion layer CDL2 in FIG. 7 is isolated by the L-shaped gate portion. The lower left area operates as one of the source and the drain of the first transistor DQ3T1 in the third transfer circuit DQ3, and is coupled with the third bit line BL3.

Likewise, the gate portion of the first transistor DQ4T1 in the fourth transfer circuit DQ4 is also L-shaped. One end of the L-shaped gate portion is protruded downward from the second common diffusion layer CDL2 in FIG. 7. Also, the other end of the L-shaped gate portion is protruded rightward from the second common diffusion layer CDL2 in FIG. 7.

As a result, a lower right area of the second common diffusion layer CDL2 in FIG. 7 is isolated by the L-shaped gate portion. The lower right area operates as one of the source and the drain of the first transistor DQ4T1 in the fourth transfer circuit DQ4, and is coupled with the fourth bit line BL4.

The other area of the second common diffusion layer CDL2 operates as the other of the source and the drain of the first transistor DQ1T1 in the first transfer circuit DQ1. This area also operates as the others of the sources and the drains of the respective first transistors DQ2T1 to DQ4T1 in the second to fourth transfer circuits DQ2 to DQ4 at the same time. This area is called "common area." This common area is coupled with the bus line BUS1.

As with the above-described second example, the third and fourth common diffusion layers CDL3 and CDL4 in FIG. 5A are shared to obtain the fifth common diffusion layer CDL5 in FIG. 7. The common area of the fifth common diffusion layer CDL5 is coupled with the dummy bus line DBUS1 instead of the bus line BUS1 coupled to the common area of the second common diffusion layer CDL2.

The other constituent elements, coupling relationships, and operation of the semiconductor integrated circuit device according to this embodiment are identical with those in the first embodiment of the present invention, and therefore a more detailed description thereof will be omitted.

According to this embodiment, the following advantages are obtained in addition to the advantages obtained in the first embodiment of the present invention. That is, the diffusion layers are shared not only in the lateral direction but also in the longitudinal direction in FIGS. 5A and 7, to thereby enable the circuit area to be further reduced. In this case, the L-shaped transistor is introduced to ensure the operation as the circuit.

The semiconductor integrated circuit device according to this embodiment has the antisymmetry as with the first embodiment of the present invention. Similarly, in this embodiment, it is assumed that the first block and the second block are defined in the same manner as those in the first embodiment of the present invention. In this example, only one first wiring that couples the bus line BUS1 with the first block is provided, which is coupled to one common diffusion layer CDL2. Also, only two second wirings that couple the bus line BUS1 with the second block are provided, which are coupled to the two common diffusion layers CDL4 and CDL6. Further, only two third wirings that couple the dummy bus line DBUS1 with the first block are provided which are coupled to the two common diffusion layers CDL1 and CDL3. Also, only one fourth wiring that couples the dummy bus line DBUS1 with the second block is provided which is coupled to one common diffusion layer CDL5.

Thus, the first wirings and the second wirings are different in number from each other. Likewise, the third wirings and the fourth wirings are different in number from each other. That is, in the semiconductor layout according to this embodiment illustrated in FIG. 7, a total number of the first to fourth wirings that couple the first block and the second block with the bus line BUS1 and the dummy bus line DBUS1 has an antisymmetric relationship. Accordingly, even this embodiment obtains the same advantages as those in the first embodiment of the present invention.

Fourth Embodiment

Figure 8:
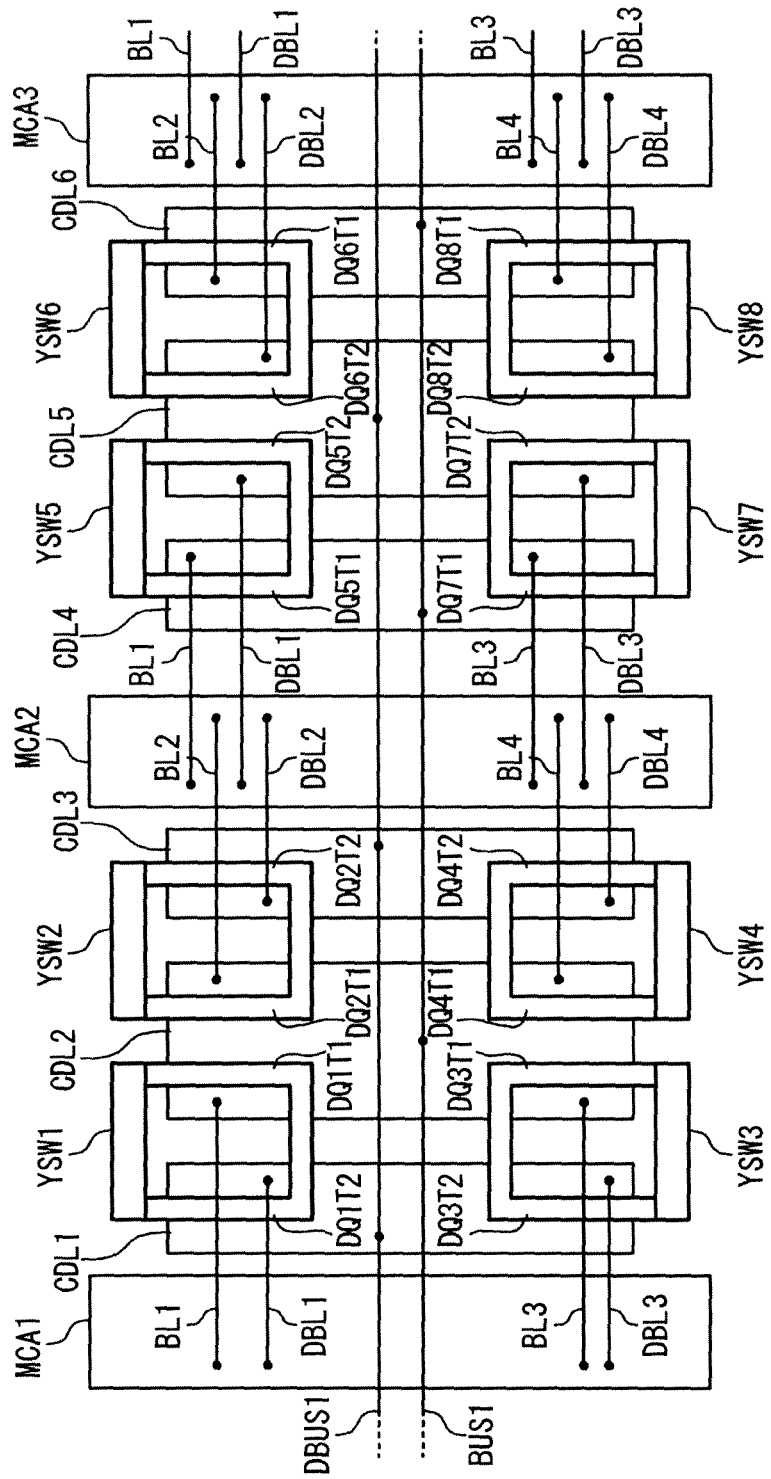
FIG. 8 is a plan view illustrating a semiconductor layout of a semiconductor integrated circuit device according to a fourth embodiment of the present invention.

FIG. 8 is a plan view illustrating a semiconductor layout of a semiconductor integrated circuit device according to a fourth embodiment of the present invention. A circuit realized by the semiconductor layout of FIG. 8 is identical with that in the first embodiment of the present invention illustrated in FIG. 5B, and therefore a more detailed description thereof will be omitted. The first to third embodiments of the present invention deal with the sense amplifier of a so-called open bit line system. On the other hand, this embodiment deals with a sense amplifier of a so-called folding bit line system. Accordingly, in the first to third embodiments of the present invention, two bit lines or dummy bit lines in total at a maximum are coupled to one memory cell array. On the other hand, in this embodiment, four bit lines or dummy bit lines in total at a maximum are coupled to one memory cell array. Also, in the first to third embodiments of the present invention, two adjacent memory cell arrays are arranged between two diffusion layers or two common diffusion layers. On the other hand, in this embodiment, the number of memory cell arrays arranged between the two common diffusion layers is one.

The semiconductor layout according to this embodiment illustrated in FIG. 8 is equivalent to the semiconductor layout according to the second embodiment of the present invention illustrated in FIG. 7, which is modified as follows. That is, as described above, the adjacent second and third memory cell arrays MCA2 and MCA3 in FIG. 7 are replaced with one memory cell array MCA2 in FIG. 8. With this change, it is assumed that the fourth memory cell array MCA4 in FIG. 7 is the third memory cell array MCA3 in FIG. 8. Further, the coupling of the first to fourth bit lines BL1 to BL4 and the first to fourth dummy bit lines DBL1 to DBL4 with the respective memory cell arrays is changed. In this situation, the coupling relationships of the first to fourth bit lines BL1 to BL4, the first to fourth dummy bit lines DBL1 to DBL4, the bus line BUS1, and the dummy bus line DBUS1 with the respective common diffusion layers are identical with those in the third embodiment of the present invention illustrated in FIG. 7.

As a first example, a description will be given of the coupling destinations of the other ends of the respective wirings having one ends coupled to the first to third common diffusion layers CDL1 to CDL3 in detail. The other end of the first bit line BL1 having one end coupled to the upper left area of the second common diffusion layer CDL2 is coupled to the first memory cell array MCA1. The other end of the second bit line BL2 having one end coupled to the upper right area of the second common diffusion layer CDL2 is coupled to the second memory cell array MCA2. The other end of the third bit line BL3 having one end coupled to the lower left area of the second common diffusion layer CDL2 is coupled to the first memory cell array MCA1. The other end of the fourth bit line BL4 having one end coupled to the lower right area of the second common diffusion layer CDL2 is coupled to the second memory cell array MCA2.

The other end of the first dummy bit line DBL1 having one end coupled to the upper right area of the first common diffusion layer CDL1 is coupled to the first memory cell array MCA1. The other end of the second dummy bit line DBL2 having one end coupled to the upper left area of the third common diffusion layer CDL3 is coupled to the second memory cell array MCA2. The other end of the third dummy bit line DBL3 having one end coupled to the upper right area of the first common diffusion layer CDL1 is coupled to the first memory cell array MCA1. The other end of the fourth dummy bit line DBL4 having one end coupled to the lower left area of the third common diffusion layer CDL3 is coupled to the second memory cell array MCA2.

The common area of the second common diffusion layer CDL2 is coupled with the bus line BUS1. The respective common areas of the first and third common diffusion layers CDL1 and CDL3 are coupled with the dummy bus line DBUS1.

As a second example, a description will be given of the coupling destinations of the other ends of the respective wirings having one ends coupled to the fourth to sixth common diffusion layers CDL4 to CDL6 in detail. The other end of the first dummy bit line DBL1 having one end coupled to the upper left area of the fifth common diffusion layer CDL5 is coupled to the second memory cell array MCA2. The other end of the second dummy bit line DBL2 having one end coupled to the upper right area of the fifth common diffusion layer CDL5 is coupled to the third memory cell array MCA3. The other end of the third dummy bit line DBL3 having one end coupled to the lower left area of the fifth common diffusion layer CDL5 is coupled to the second memory cell array MCA2. The other end of the fourth dummy bit line DBL4 having one end coupled to the lower right area of the fifth common diffusion layer CDL5 is coupled to the third memory cell array MCA3.

The other end of the first bit line BL1 having one end coupled to the upper right area of the fourth common diffusion layer CDL4 is coupled to the second memory cell array MCA2. The other end of the second bit line BL2 having one end coupled to the upper left area of the sixth common diffusion layer CDL6 is coupled to the third memory cell array MCA3. The other end of the third bit line BL3 having one end coupled to the lower right area of the fourth common diffusion layer CDL4 is coupled to the second memory cell array MCA2. The other end of the fourth bit line BL4 having one end coupled to the lower left area of the sixth common diffusion layer CDL6 is coupled to the third memory cell array MCA3.

The common area of the fifth common diffusion layer CDL5 is coupled with the dummy bus line DBUS1. The respective common areas of the fourth and sixth common diffusion layers CDL4 and CDL6 are coupled with the bus line BUS1.

In FIG. 8, the coupling relationships of the first memory cell array MCA1 with the first to fourth dummy bit lines DBL1 to DBL4 are not omitted. However, this configuration absolutely represents an example of the end of the semiconductor layout, and does not limit the present invention.

The other constituent elements, coupling relationships, and operation of the semiconductor integrated circuit device according to this embodiment are identical with those in the third embodiment of the present invention, and therefore a more detailed description thereof will be omitted.

In the semiconductor layout according to this embodiment, the second memory cell array MCA2 and the first to third common diffusion layers CDL1 to CDL3 are called "first configuration unit". Also, the third memory cell array MCA3 and the fourth to sixth common diffusion layers CDL4 to CDL6 are called "second configuration unit". The first and second configuration units are alternately arranged in the lateral direction of FIG. 8, to thereby balance the capacitive loads of the bus line BUS1 and the dummy bus line DBUS1 which are the wiring pair.

According to this embodiment, not only when the sense amplifier of the open bit line system is used according to the first to third embodiments of the present invention, but also when the sense amplifier of the folding bit line system is used, both of a reduction in the circuit area, and the balance of the capacitive loads between the wiring pair can be performed.

As in the third embodiment of the present invention, the semiconductor integrated circuit device according to this embodiment also has the antisymmetry. However, this embodiment is different from the third embodiment of the present invention in that the memory cell array included in the first block is configured by the first memory cell array MCA1 and a part of the second memory cell array MCA2, and the memory cell array included in the second block is configured by a part of the second memory cell array MCA2, and the third memory cell array MCA3. The other features and advantages pertaining to the antisymmetry in the semiconductor integrated circuit device according to this embodiment are identical with those in the third embodiment of the present invention, and therefore a more detailed description thereof will be omitted.

Fifth Embodiment

Figure 9:
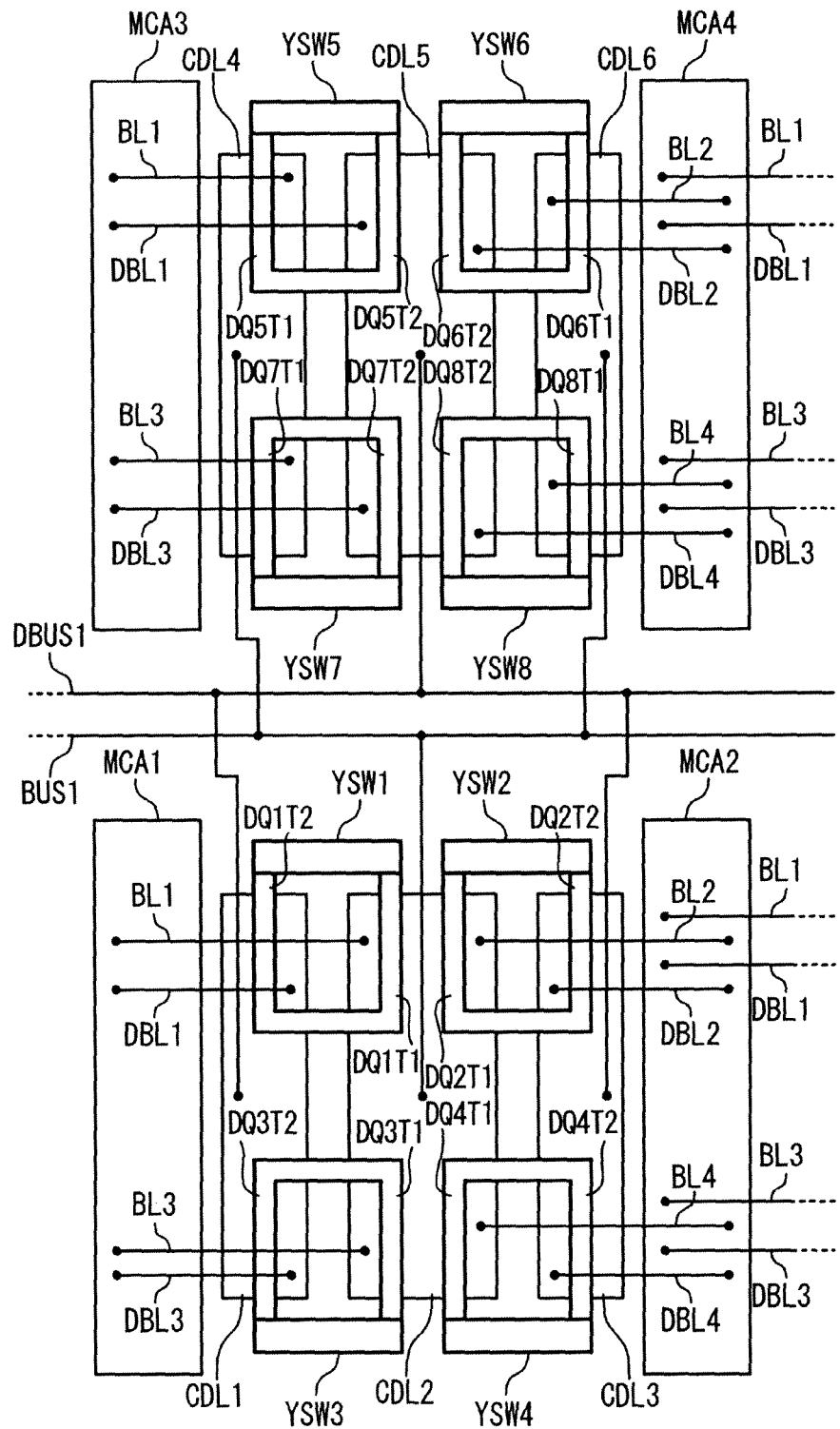
FIG. 9 is a plan view illustrating a semiconductor layout of a semiconductor integrated circuit device according to a fifth embodiment of the present invention.

FIG. 9 is a plan view illustrating a semiconductor layout of a semiconductor integrated circuit device according to a fifth embodiment of the present invention. A circuit realized by the semiconductor layout of FIG. 9 is identical with that in the first embodiment of the present invention illustrated in FIG. 5B, and therefore a more detailed description thereof will be omitted. The semiconductor layout of FIG. 9 is equivalent to the first and second configuration units aligned in the lateral direction of FIG. 8 in the fourth embodiment of the present invention, which is realigned in the longitudinal direction. That is, the first and second memory cell arrays MCA1 and MCA2 according to this embodiment illustrated in FIG. 9 are equivalent to the first and second memory cell arrays MCA1 and MCA2 according to the fourth embodiment of the present invention illustrated in FIG. 8. Also, the first to third common diffusion layers according to this embodiment illustrated in FIG. 9 are equivalent to the first to third common diffusion layers according to the fourth embodiment of the present invention illustrated in FIG. 8. Likewise, the third and fourth memory cell arrays MCA3 and MCA4 in FIG. 9 are equivalent to the second and third memory cell arrays MCA2 and MCA3 according to the fourth embodiment of the present invention illustrated in FIG. 8. The fourth to sixth common diffusion layers according to this embodiment illustrated in FIG. 9 are equivalent to the fourth to sixth common diffusion layers according to the fourth embodiment of the present invention illustrated in FIG. 8. Further, the bus line BUS1 according to this embodiment illustrated in FIG. 9 is also coupled to the second, fourth, and sixth common diffusion layers CDL2, CDL4, and CDL6 as in the fourth embodiment of the present invention illustrated in FIG. 8. Also, the dummy bus line DBUS1 according to this embodiment illustrated in FIG. 9 is also coupled to the first, third, and fifth common diffusion layers CDL1, CDL3, and CDL5 as in the fourth embodiment of the present invention illustrated in FIG. 8.

In FIG. 9, the coupling relationships of the first and third memory cell arrays MCA1 and MCA3 with the first to fourth dummy bit lines DBL1 to DBL4 are not omitted. However, this configuration absolutely represents an example of the end of the semiconductor layout, and does not limit the present invention.

The other constituent elements, coupling relationships, and operation of the semiconductor integrated circuit device according to this embodiment are identical with those in the fourth embodiment of the present invention, and therefore a more detailed description thereof will be omitted.

According to this embodiment, the same advantages as those in the fourth embodiment of the present invention are obtained. The first and second configuration units are alternately arranged in the lateral direction in FIG. 8 in the fourth embodiment of the present invention, but alternately arranged in the longitudinal direction of FIG. 9 in this embodiment.

Accordingly, the semiconductor integrated circuit device according to this embodiment also has the antisymmetry as in the fourth embodiment of the present invention. This embodiment is different from the fourth embodiment of the present invention in that the memory cell arrays included in the first block are the first memory cell array MCA1 and a part of the second memory cell array MCA2, and the memory cell arrays included in the second block are the third memory cell array MCA3 and a part of the fourth memory cell array MCA4. The other features and advantages pertaining to the antisymmetry in the semiconductor integrated circuit device according to this embodiment are identical with those in the fourth embodiment of the present invention, and therefore a more detailed description will be omitted.

Sixth Embodiment

Figure 10:
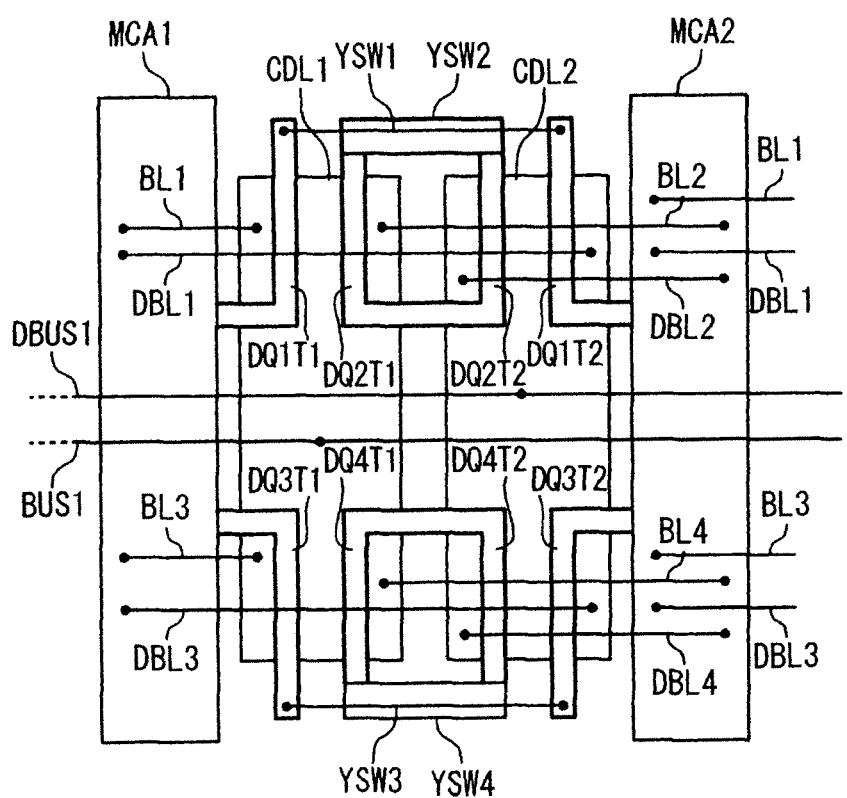
FIG. 10 is a plan view illustrating a semiconductor layout of a semiconductor integrated circuit device according to a sixth embodiment of the present invention.

FIG. 10 is a plan view illustrating a semiconductor layout of a semiconductor integrated circuit device according to a sixth embodiment of the present invention. A circuit realized by the semiconductor layout of FIG. 10 is identical with a left half of the first embodiment of the present invention illustrated in FIG. 5B, that is, a portion pertaining to the first to fourth transfer circuits DQ1 to DQ4, and therefore a more detailed description thereof will be omitted.

The semiconductor layout of FIG. 10 includes the first and second memory cell arrays MCA1 and MCA2, the first and second common diffusion layers CDL1 and CDL2, the first to fourth bit lines BL1 to BL4, the first to fourth dummy bit lines DBL1 to DBL4, the first to fourth column select signal lines YSW1 to YSW4, the bus line BUS1, and the dummy bus line DBUS1.

The first common diffusion layer CDL1 is formed with the first transistors DQ1T1 to DQ4T1 of the respective first to fourth transfer circuits DQ1 to DQ4. In this example, the respective gate portions of the first transistors DQ1T1 to DQ4T1 in the respective first to fourth transfer circuits DQ1 to DQ4 are L-shaped.

The L-shaped gate portion of the first transistor DQ1T1 in the first transfer circuit DQ1 has one end protruded upward from the first common diffusion layer CDL1 in FIG. 10. Also, the L-shaped gate portion has the other end protruded leftward, likewise. As a result, the upper left area of the first common diffusion layer CDL1 in FIG. 10 is isolated by the L-shaped portion. The upper left area operates as one of the source and the drain of the first transistor DQ1T1 in the first transfer circuit DQ1, and is coupled with the first bit line BL1. The first bit line BL1 is also coupled to the first memory cell array MCA1.

The L-shaped gate portion of the first transistor DQ2T1 in the second transfer circuit DQ2 has one end protruded upward from the first common diffusion layer CDL1 in FIG. 10. Also, the L-shaped gate portion has the other end protruded rightward, likewise. As a result, the upper right area of the first common diffusion layer CDL1 in FIG. 10 is isolated by the L-shaped portion. The upper right area operates as one of the source and the drain of the first transistor DQ2T1 in the second transfer circuit DQ2, and is coupled with the second bit line BL2. The second bit line BL2 is also coupled to the second memory cell array MCA2.

The L-shaped gate portion of the first transistor DQ3T1 in the third transfer circuit DQ3 has one end protruded downward from the first common diffusion layer CDL1 in FIG. 10. Also, the L-shaped gate portion has the other end protruded leftward, likewise. As a result, the lower left area of the first common diffusion layer CDL1 in FIG. 10 is isolated by the L-shaped portion. The lower left area operates as one of the source and the drain of the first transistor DQ3T1 in the third transfer circuit DQ3, and is coupled with the third bit line BL3. The third bit line BL3 is also coupled to the first memory cell array MCA1.

The L-shaped gate portion of the first transistor DQ4T1 in the fourth transfer circuit DQ4 has one end protruded downward from the first common diffusion layer CDL1 in FIG. 10. Also, the L-shaped gate portion has the other end protruded rightward, likewise. As a result, the lower right area of the first common diffusion layer CDL1 in FIG. 10 is isolated by the L-shaped portion. The lower right area operates as one of the source and the drain of the first transistor DQ4T1 in the fourth transfer circuit DQ4, and is coupled with the fourth bit line BL4. The fourth bit line BL4 is also coupled to the second memory cell array MCA2.

The other area of the first common diffusion layer CDL1 are shared as the others of the sources and the drains of the respective first transistors DQ1T1 to DQ4T1 in the respective first to fourth transfer circuits DQ1 to DQ4, and operates. This area is called "common area". This common area is coupled with the bus line BUS1.

Likewise, the L-shaped gate portion of the second transistor DQ1T2 in the first transfer circuit DQ1 has one end protruded upward from the second common diffusion layer CDL2 in FIG. 10. Also, the L-shaped gate portion has the other end protruded rightward, likewise. As a result, the upper right area of the second common diffusion layer CDL2 in FIG. 10 is isolated by the L-shaped portion. The upper right area operates as one of the source and the drain of the second transistor DQ1T2 in the first transfer circuit DQ1, and is coupled with the first dummy bit line DBL1. The first dummy bit line DBL1 is also coupled to the first memory cell array MCA1.

The L-shaped gate portion of the second transistor DQ2T2 in the second transfer circuit DQ2 has one end protruded upward from the second common diffusion layer CDL2 in FIG. 10. Also, the L-shaped gate portion has the other end protruded leftward, likewise. As a result, the upper left area of the second common diffusion layer CDL2 in FIG. 10 is isolated by the L-shaped portion. The upper left area operates as one of the source and the drain of the second transistor DQ1T2 in the second transfer circuit DQ2, and is coupled with the second dummy bit line DBL2. The second dummy bit line DBL2 is also coupled to the second memory cell array MCA2.

The L-shaped gate portion of the second transistor DQ3T2 in the third transfer circuit DQ3 has one end protruded downward from the second common diffusion layer CDL2 in FIG. 10. Also, the L-shaped gate portion has the other end protruded rightward, likewise. As a result, the lower right area of the second common diffusion layer CDL2 in FIG. 10 is isolated by the L-shaped portion. The lower right area operates as one of the source and the drain of the second transistor DQ3T2 in the third transfer circuit DQ3, and is coupled with the third dummy bit line DBL3. The third dummy bit line DBL3 is also coupled to the first memory cell array MCA1.

The L-shaped gate portion of the second transistor DQ4T2 in the fourth transfer circuit DQ4 has one end protruded downward from the second common diffusion layer CDL2 in FIG. 10. Also, the L-shaped gate portion has the other end protruded leftward, likewise. As a result, the lower left area of the second common diffusion layer CDL2 in FIG. 10 is isolated by the L-shaped portion. The lower right area operates as one of the source and the drain of the second transistor DQ4T2 in the fourth transfer circuit DQ4, and is coupled with the fourth dummy bit line DBL4. The fourth dummy bit line DBL4 is also coupled to the second memory cell array MCA2.

The other area of the second common diffusion layer CDL2 are shared as the others of the sources and the drains of the respective second transistors DQ1T2 to DQ4T2 in the respective first to fourth transfer circuits DQ1 to DQ4, and operates. This area is called "common area". This common area is coupled with the dummy bus line DBUS1.

The first column select signal line YSW1 couples the upward protruded portions of the respective L-shaped gate portions of the first and second transistors DQ1T1 and DQ1T2 in the first transfer circuit DQ1 with each other. The second column select signal line YSW2 couples the upward protruded portions of the respective L-shaped gate portions of the first and second transistors DQ2T1 and DQ2T2 in the second transfer circuit DQ2 with each other. The third column select signal line YSW3 couples the downward protruded portions of the respective L-shaped gate portions of the first and second transistors DQ3T1 and DQ3T2 in the third transfer circuit DQ3 with each other. The fourth column select signal line YSW4 couples the downward protruded portions of the respective L-shaped gate portions of the first and second transistors DQ4T1 and DQ4T2 in the fourth transfer circuit DQ4 with each other.

In FIG. 10, the first memory cell array MCA1 is not coupled with the second bit line BL2, the second dummy bit line DBL2, the fourth bit line BL4, and the fourth dummy bit line DBL4. However, this configuration absolutely represents an example in which the first memory cell array MCA1 is arranged on the end, and does not limit the present invention.

According to the semiconductor layout of this embodiment, the circuit area can be further reduced as compared with the first to fifth embodiments of the present invention. Further, according to the semiconductor layout of this embodiment, the subject configuration units of the semiconductor integrated circuit device are reduced by half. That is, the first and second common diffusion layers CDL1 and CDL2, and one of the first and second memory cell arrays MCA1 and MCA2 are regarded as the configuration unit. When the configuration units are merely aligned in the lateral direction in FIG. 10, the capacitive loads of the bus line BUS1 and the dummy bus line DBUS1 which are the wiring pair are balanced with each other.

On the other hand, in this embodiment, as compared with the first to fifth embodiments of the present invention, variations of the lengths of the respective bit lines and the respective dummy bit lines are noticeable. However, the sizes of the respective memory cell arrays in the lateral direction in FIG. 10 are actually larger than the respective common diffusion layers, and therefore those variations fall within an error range.

The semiconductor layout according to the respective embodiments of the present invention can be freely combined together if there is no technical discrepancy.

What is claimed is:

1. A semiconductor integrated circuit device, comprising:
   a wiring pair;
   a first transistor group having a source or a drain coupled to one of the wiring pair;
   a second transistor group having a source or a drain coupled to the other of the wiring pair;
   a first diffusion layer group in which the first transistor group is formed;
   a second diffusion layer group in which the second transistor group is formed,
   wherein the first diffusion layer group includes a first common diffusion layer group that is included in the first transistor group and in which a plurality of transistors sharing a source or a drain is formed,
   wherein the second diffusion layer group includes a second common diffusion layer group that is included in the second transistor group and in which a plurality of transistors sharing a source or a drain is formed, and
   wherein a first capacitive load of the one of the wiring pair is balanced with a second capacitive load of the other of the wiring pair; and
   a plurality of memory cell arrays aligned in a first direction, wherein the first and second diffusion layer groups are alternately arranged in the first direction, and wherein total number of wirings coupling the first transistor group and the second transistor group with the one of the wiring pair and the other of the wiring pair, respectively, has an antisymmetric relationship.

2. The semiconductor integrated circuit device according to claim 1, wherein the plurality of memory cell arrays includes first to fourth memory cell arrays arranged in the first direction in the stated order, wherein the first diffusion layer group includes first and second diffusion layers, wherein the second diffusion layer group includes third and fourth diffusion layers, wherein the first common diffusion layer group includes a first two-transistor shared diffusion layer that is included in the first transistor group, and in which two transistors sharing the source or the drain are formed, wherein the second common diffusion layer group includes a second two-transistor shared diffusion layer that is included in the second transistor group, and in which two transistors sharing the source or the drain are formed, and wherein the first memory cell array, the first diffusion layer, the second two-transistor shared diffusion layer, the second diffusion layer, the second memory cell array, the third memory cell array, the third diffusion layer, the first two-transistor shared diffusion layer, the fourth diffusion layer, and the fourth memory cell array are arranged in the first direction and in the stated order.

3. The semiconductor integrated circuit device according to claim 1, wherein the plurality of memory cell arrays includes first and second memory cell arrays arranged in the first direction in the stated order, wherein the first diffusion layer group includes first and second diffusion layers, wherein the second diffusion layer group includes third and fourth diffusion layers, wherein the first common diffusion layer group includes a first two-transistor shared diffusion layer that is included in the first transistor group, and in which two transistors sharing the source or the drain are formed, wherein the second common diffusion layer group includes a second two-transistor shared diffusion layer that is included in the second transistor group, and in which two transistors sharing the source or the drain are formed, wherein the first memory cell array, the first diffusion layer, the second two-transistor shared diffusion layer, the second diffusion layer, and the second memory cell array are arranged in the first direction in the stated order, and wherein the first memory cell array, the third diffusion layer, the first two-transistor shared diffusion layer, the fourth diffusion layer, and the second memory cell array are arranged in the first direction in the stated order.

4. The semiconductor integrated circuit device according to claim 1, wherein the first common diffusion layer group includes first and second two-transistor shared diffusion layers that are each included in the first transistor group, and in each of which two transistors sharing the source or the drain are formed, and a first four-transistor shared diffusion layer that is included in the first transistor group, and in which four transistors sharing the source or the drain are formed, wherein the second common diffusion layer group includes third and fourth two-transistor shared diffusion layers that are each included in the second transistor group, and in each of which two transistors sharing the source or the drain are formed, and a second four-transistor shared diffusion layer that is included in the second transistor group, and in which four transistors sharing the source or the drain are formed, wherein the plurality of memory cell arrays includes first and second memory cell arrays arranged in the first direction in the stated order, and third and fourth memory cell arrays arranged in the first direction in the stated order, wherein the first memory cell array, the first two-transistor shared diffusion layer, the first four-transistor shared diffusion layer, the second two-transistor shared diffusion layer, and the second memory cell array are arranged in the first direction in the stated order, and wherein the third memory cell array, the third two-transistor shared diffusion layer, the second four-transistor shared diffusion layer, the fourth two-transistor shared diffusion layer, and the fourth memory cell array are arranged in the first direction in the stated order.

5. The semiconductor integrated circuit device according to claim 4, wherein the first memory cell array, the first two-transistor shared diffusion layer, the second four-transistor shared diffusion layer, the first four-transistor shared diffusion layer, and the second memory cell array are arranged in the first direction in the stated order as a first configuration unit, wherein the third memory cell array, the third two-transistor shared diffusion layer, the second four-transistor shared diffusion layer, the fourth two-transistor shared diffusion layer, and the fourth memory cell array are arranged in the first direction in the stated order as a second configuration unit, and wherein the first and second configuration units are arranged in the first direction.

6. The semiconductor integrated circuit device according to claim 4, wherein the first memory cell array, the first two-transistor shared diffusion layer, the second four-transistor shared diffusion layer, the first four-transistor shared diffusion layer, and the second memory cell array are arranged in the first direction in the stated order as a first configuration unit, wherein the third memory cell array, the third two-transistor shared diffusion layer, the second four-transistor shared diffusion layer, the fourth two-transistor shared diffusion layer, and the fourth memory cell array are arranged in the first direction in the stated order as a second configuration unit, and wherein the first and second configuration units are arranged in a second direction different from the first direction.

7. The semiconductor integrated circuit device according to claim 1, wherein the first common diffusion layer group includes first and second two-transistor shared diffusion layers that are each included in the first transistor group, and in each of which two transistors sharing the source or the drain are formed, and a first four-transistor shared diffusion layer that is included in the first transistor group, and in which four transistors sharing the source or the wherein the second common diffusion layer group includes third and fourth two-transistor shared diffusion layers that are each included in the second transistor group, and in each of which two transistors sharing the source or the drain are formed, and a second four-transistor shared diffusion layer that is included in the second transistor group, and in which four transistors sharing the source or the drain are formed, wherein the plurality of memory cell arrays includes first to third memory cell arrays arranged in the first direction in the stated order, and wherein the first memory cell array, the first two-transistor shared diffusion layer, the second four-transistor shared diffusion layer, the second two-transistor shared diffusion layer, the second memory cell array, the third two-transistor shared diffusion layer, the first four-transistor shared diffusion layer, the fourth two-transistor shared diffusion layer, and the third memory cell array are arranged in the first direction in the stated order.

8. The semiconductor integrated circuit device according to claim 1, wherein the first common diffusion layer group includes a first four-transistor shared diffusion layer that is included in the first transistor group, and in which four transistors sharing the source or the drain are formed, wherein the second common diffusion layer group includes a second four-transistor shared diffusion layer that is included in the second transistor group, and in which four transistors sharing the source or the drain are formed, wherein the plurality of memory cell arrays includes first and second memory cell arrays arranged in the first direction in the stated order, and wherein the first memory cell array, the first fourth-transistor shared diffusion layer, the second four-transistor shared diffusion layer, and the second memory cell array are arranged in the first direction in the stated order.

9. A semiconductor storage device, comprising:
the semiconductor integrated circuit device according to claim 1;
a plurality of bit lines that is coupled to the plurality of memory cell arrays;
a plurality of word lines that is coupled to the plurality of memory cell arrays;
a plurality of bus lines including the wiring pair;
a plurality of column selector circuits including the first and second transistor groups; and
a plurality of sense amplifier circuits including the plurality of column selector circuits.

10. The semiconductor integrated circuit device according to claim 1,
wherein the first and second diffusion layer groups are alternately repeated in the first direction.

11. The semiconductor integrated circuit device according to claim 1,
wherein the first and second diffusion layer groups are staggered in the first direction.

12. A semiconductor storage device, comprising:
a wiring pair;
a first block including a plurality of elements that is coupled to any one of the wiring pair through at least one first wiring;
a second block including a plurality of elements that is coupled to any one of the wiring pair through at least one second wiring as with the plurality of elements of the first block, wherein the first wiring and the second wiring which are coupled to one of the wiring pair are different in number from each other; and
a plurality of memory cell arrays aligned in a first direction,
wherein the first and second blocks are alternately arranged in the first direction,
wherein a first capacitive load of the one of the wiring pair is balanced with a second capacitive load of the other of the wiring pair, and
wherein total number of wirings coupling the first block and the second block with with the one of the wiring pair and the other of the wiring pair, respectively, has an antisymmetric relationship.

13. The semiconductor storage device according to claim 12, wherein the first and second blocks are alternately repeated in the first direction,
wherein the plurality of elements from the first block comprising a plurality of first transistor groups, and
wherein the plurality of elements from the second block comprising a plurality of second transistor groups.

14. The semiconductor storage device according to claim 12,
wherein the first and second blocks are staggered and repeated in the first direction.

15. A method of forming a semiconductor integrated circuit device, the method comprising:
forming a wiring pair;
forming a first transistor group including a source or a drain coupled to one of the wiring pair;
forming a second transistor group including a source or a drain coupled to the other of the wiring pair;
forming a first diffusion layer group in which the first transistor group is formed;
forming a second diffusion layer group in which the second transistor group is formed,
wherein the first diffusion layer group includes a first common diffusion layer group that is included in the first transistor group and in which a plurality of transistors sharing a source or a drain is formed,
wherein the second diffusion layer group includes a second common diffusion layer group that is included in the second transistor group and in which a plurality of transistors sharing a source or a drain is formed, and
wherein a first capacitive load of the one of the wiring pair is balanced with a second capacitive load of the other of the wiring pair; and
forming a plurality of memory cell arrays aligned in a first direction,
wherein the first and second diffusion layer groups are alternately arranged in the first direction, and
wherein total number of wirings coupling the first transistor group and the second transistor group with the one of the wiring pair and the other of the wiring pair, respectively, has an antisymmetric relationship.

16. The method according to claim 15,
wherein the plurality of memory cell arrays includes first to fourth memory cell arrays arranged in the first direction in the stated order,
wherein the first diffusion layer group includes first and second diffusion layers,
wherein the second diffusion layer group includes third and fourth diffusion layers,
wherein the first common diffusion layer group includes a first two-transistor shared diffusion layer that is included in the first transistor group, and in which two transistors sharing the source or the drain are formed, wherein the second common diffusion layer group includes a second two-transistor shared diffusion layer that is included in the second transistor group, and in which two transistors sharing the source or the drain are formed, and wherein the first memory cell array, the first diffusion layer, the second two-transistor shared diffusion layer, the second diffusion layer, the second memory cell array, the third memory cell array, the third diffusion layer, the first two-transistor shared diffusion layer, the fourth diffusion layer, and the fourth memory cell array are arranged in the first direction and in the stated order.

17. The method according to claim 15, wherein the plurality of memory cell arrays includes first and second memory cell arrays arranged in the first direction in the stated order, wherein the first diffusion layer group includes first and second diffusion layers, wherein the second diffusion layer group includes third and fourth diffusion layers, wherein the first common diffusion layer group includes a first two-transistor shared diffusion layer that is included in the first transistor group, and in which two transistors sharing the source or the drain are formed, wherein the second common diffusion layer group includes a second two-transistor shared diffusion layer that is included in the second transistor group, and in which two transistors sharing the source or the drain are formed, wherein the first memory cell array, the first diffusion layer, the second two-transistor shared diffusion layer, the second diffusion layer, and the second memory cell array are arranged in the first direction in the stated order, and wherein the first memory cell array, the third diffusion layer, the first two-transistor shared diffusion layer, the fourth diffusion layer, and the second memory cell array are arranged in the first direction in the stated order.

18. The method according to claim 15, wherein the first common diffusion layer group includes first and second two-transistor shared diffusion layers that are each included in the first transistor group, and in each of which two transistors sharing the source or the drain are formed, and a first four-transistor shared diffusion layer that is included in the first transistor group, and in which four transistors sharing the source or the drain are formed, wherein the second common diffusion layer group includes third and fourth two-transistor shared diffusion layers that are each included in the second transistor group, and in each of which two transistors sharing the source or the drain are formed, and a second four-transistor shared diffusion layer that is included in the second transistor group, and in which four transistors sharing the source or the drain are formed, wherein the plurality of memory cell arrays includes first and second memory cell arrays arranged in the first direction in the stated order, and third and fourth memory cell arrays arranged in the first direction in the stated order, wherein the first memory cell array, the first two-transistor shared diffusion layer, the first four-transistor shared diffusion layer, the second two-transistor shared diffusion layer, and the second memory cell array are arranged in the first direction in the stated order, and wherein the third memory cell array, the third two-transistor shared diffusion layer, the second four-transistor shared diffusion layer, the fourth two-transistor shared diffusion layer, and the fourth memory cell array are arranged in the first direction in the stated order.

19. The method according to claim 15, wherein the first and second diffusion layer groups are alternately arranged and repeated in the first direction.

* * * * *